US006919951B2

(12) United States Patent
Tsuji

(10) Patent No.: US 6,919,951 B2
(45) Date of Patent: Jul. 19, 2005

(54) ILLUMINATION SYSTEM, PROJECTION EXPOSURE APPARATUS AND DEVICE MANUFACTURING METHOD

(75) Inventor: Toshihiko Tsuji, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 114 days.

(21) Appl. No.: 10/205,348

(22) Filed: Jul. 25, 2002

(65) Prior Publication Data

US 2003/0031017 A1 Feb. 13, 2003

(30) Foreign Application Priority Data

Jul. 27, 2001 (JP) .......................... 2001-228796
Jul. 31, 2001 (JP) .......................... 2001-232682

(51) Int. Cl.[7] .................... G03B 27/54; G03B 27/42
(52) U.S. Cl. .................................. 355/67; 355/53
(58) Field of Search .................... 355/52, 53, 55, 355/67–71; 356/399–401; 250/548; 378/34; 359/618, 726

(56) References Cited

U.S. PATENT DOCUMENTS

| | | | |
|---|---|---|---|
| 4,918,583 A | 4/1990 | Kudo et al. | |
| 5,669,708 A | 9/1997 | Mashima et al. | |
| 5,677,939 A | 10/1997 | Oshino | |
| 5,891,806 A | 4/1999 | Shibuya et al. | |
| 5,995,582 A | 11/1999 | Terashima et al. | |
| 6,045,976 A | 4/2000 | Haruki et al. | |
| 6,078,641 A | 6/2000 | Mitsui et al. | |
| 6,266,389 B1 * | 7/2001 | Murayama et al. | 378/34 |
| 6,452,661 B1 * | 9/2002 | Komatsuda | 355/67 |
| 6,504,896 B2 * | 1/2003 | Miyake et al. | 378/34 |
| 6,526,118 B2 * | 2/2003 | Komatsuda et al. | 378/34 |
| 6,594,334 B1 * | 7/2003 | Ota | 378/34 |

2002/0136351 A1 9/2002 Singer

FOREIGN PATENT DOCUMENTS

| | | |
|---|---|---|
| EP | 0 416 811 A2 | 3/1991 |
| EP | 0 435 644 A2 | 7/1991 |
| EP | 0 939 341 A2 | 9/1999 |
| EP | 1 202 101 A2 | 5/2000 |
| EP | 1 026 547 A2 | 8/2000 |
| EP | 1 028 456 A1 | 8/2000 |
| JP | 7-235472 | 9/1995 |
| JP | 11-312638 | 11/1999 |
| WO | 1 028 456 A1 | 8/2000 |
| WO | 01/09681 A2 | 2/2001 |
| WO | WO 01/09681 A2 | 2/2001 |

OTHER PUBLICATIONS

Official Search Report from European Patent Office issued in foreign counterpart application No. EP 02 25 5194.
Partial European Search Report, Dated Nov. 18, 2003.

* cited by examiner

Primary Examiner—Henry Hung Nguyen
(74) Attorney, Agent, or Firm—Morgan & Finnegan, LLP

(57) ABSTRACT

Disclosed is an illumination system for illuminating an illumination region with uniform illuminance, wherein the light intensity gravity center of light impinging on the illumination region is registered with the center of light rays. The illumination system includes a first reflection type integrator, a first condensing mirror system for superposing light beams from the first reflection type integrator one upon another on the surface to be illuminated, a second reflection type integrator disposed between the light source and said first reflection type integrator, and a second condensing mirror system for superposing light beams from the second reflection type integrator one upon another on the first reflection type integrator. Also disclosed is an exposure apparatus having such illumination system, and a device manufacturing method using the same.

4 Claims, 19 Drawing Sheets

—PRIOR ART—

−PRIOR ART−

ILLUMINATION SYSTEM, PROJECTION EXPOSURE APPARATUS AND DEVICE MANUFACTURING METHOD

FIELD OF THE INVENTION AND RELATED ART

This invention relates generally to an illumination system. More particularly, the invention concerns an illumination system, an exposure apparatus and a device manufacturing method in which a light source of extreme ultraviolet (EUV) region of a wavelength 200–100 nm or X-ray region is used for exposure of a workpiece such as a monocrystal substrate for a semiconductor wafer or a glass substrate for a liquid crystal display (LCD), for example.

As an example of a method of producing semiconductor circuit devices having fine patterns, there is a reduction projection exposure method which uses EUV light of a wavelength 13.4 nm. With this method, a mask or reticle (which can be used interchangeably, in the present invention) having a circuit pattern formed thereon is illuminated with EUV light and an image of the pattern of the mask is projected in a reduced scale upon the surface of a wafer, whereby a resist on that surface is exposed and the pattern is transferred thereto.

The resolution R of a projection exposure apparatus is given by the following equation, on the basis of a wavelength $\lambda$ of an exposure light source and a proportion constant k1:

$$R = k1 \times (\lambda/NA) \quad (1)$$

On the other hand, the focus range in which a certain imaging performance can be held is called a depth of focus. The depth of focus DOF is given by the following equation, on the basis of a proportion constant k2:

$$DOF = k1 \times (\lambda/NA^2) \quad (2)$$

FIG. 18 is a schematic view of a main portion of a conventional EUV reduction projection exposure apparatus 1000. In FIG. 18, denoted at 1001 is a light emission point of EUV light. Denoted at 1002 is a EUV light beam, and denoted at 1003 is a filter. Denoted at 1004 is a first rotational parabolic mirror, and denoted at 1005 is a reflection type integrator. Denoted at 1006 is a second rotational parabolic mirror, and denoted at 1007 is a reflection type mask. Denoted at 1008 are plural mirror systems which constitute a projection optical system, and denoted at 1009 is a wafer. Denoted at 1010 is a mask stage, and denoted at 1011 is a wafer stage. Denoted at 1012 is an arcuate aperture, and denoted at 1013 is a laser light source. Denoted at 1014 is a laser condensing optical system, and denoted at 1017 is a vacuum container. FIG. 19 is a plan view for explaining the relation between an illumination region 1015 on the mask 1007 and an arcuate region 1016 where exposure is carried out.

Thus, the exposure apparatus 1000 comprises a light source unit (1013 and 1014), an illumination optical system (i.e. first rotational parabolic mirror 1004, reflection type integrator 1005 and second rotational parabolic mirror 1006), a reflection type mask 1007, a projection optical system 1007, a wafer 1009, a stage 1010 having a mask held thereon, a stage 1011 having a wafer held thereon, an alignment mechanism (not shown) for precision alignment of a mask and a wafer, a vacuum container 1017 for keeping the whole optical system in a vacuum to avoid attenuation of the EUV light, a gas discharging unit (not shown), and so on.

In the illumination optical system, EUV light 1002 from the light emission point 1001 is collected by the first rotational parabolic mirror 1004 and it is projected on the reflection type integrator 1005, whereby secondary light sources are produced. The EUV lights from the secondary light sources are collected and superposed one upon another by the second rotational parabolic mirror, thereby to illuminate the mask 1007 uniformly.

The reflection type mask 1007 comprises a multilayered film reflection mirror having formed thereon a non-reflective portion, made of a EUV absorptive material, for example, to define a transfer pattern. The EUV light reflected by the reflection type mask 1007 and thus having information regarding a circuit pattern, is imaged by the projection optical system 1008 upon the wafer 1009 surface.

The projection optical system 1008 is designed to show a good imaging performance in a narrow arcuate region, out of the optical axis center. In consideration of it, an aperture 1012 having an arcuate opening is provided just before the wafer 1009, to ensure that only this narrow arcuate region is used for the exposure. In order to assure that the pattern on the whole mask surface having a rectangular shape is transferred, the exposure process is carried out while the reflection type mask 1007 and the wafer 1009 are simultaneously scanned.

The projection optical system 1008 is constituted by plural multilayered film mirrors, and it is so structured that the pattern of the mask 1007 is projected in a reduced scale on the wafer 1009 surface. Usually, it comprises an image-side telecentric system. As regards the object side (reflection type mask side), usually it has a non-telecentric structure to avoid physical interference with illumination light impinging on the mask 1007.

Laser light from the laser light source 1013 is collected, by the laser condensing optical system 1014, at a target (not shown) which is disposed at the light emission point, whereby a high-temperature plasma light source is produced. EUV light 1002 emitted by heat radiation from this plasma light source is reflected by the rotational parabolic mirror 1004, whereby parallel EUV light is produced. This parallel light beam is reflected by the reflection type integrator 1005, whereby a number of secondary light sources is produced.

The EUV light from the secondary light sources is reflected by the second rotational parabolic mirror 1006 to illuminate the reflection type mask 1007. Here, the distance from the secondary light sources to the second rotational parabolic mirror 1006 and the distance from the second rotational parabolic mirror 1006 to the reflection type mask 1007 are set to be equal to the focal distance of the second rotational parabolic mirror 1006.

Since the focal point of the second rotational parabolic mirror 1006 is disposed at the position of the secondary light sources, EUV light which is emitted from one secondary light source illuminates the mask 1007 as parallel light. Thus, the condition for Koehler illumination is satisfied. In other words, the EUV light which illuminates a certain single point on the reflection type mask is defined by superposition of EUV light rays emitted from all the secondary light sources, respectively.

As shown in FIG. 19, the illumination region 1015 on the mask surface is analogous to the planar shape of the reflection surface of a convex or concave mirror which is a constituent of the reflection type integrator 1005. If the mirror shape is rectangular, it becomes an approximately rectangular region, containing the arcuate region 1016 in which the exposure is to be actually carried out. The projection optical system 1008 is designed so that an image of the secondary light sources is projected on an entrance pupil of the projection optical system 1008.

The arcuate region on the mask 1007 must be illuminated without irregular illuminance. In addition to it, the gravity center of the light intensity of light rays impinging on the arcuate region must be registered with the center of the light rays. However, in conventional EUV reduction projection exposure apparatuses, these conditions are not always satisfied. As a consequence, if, at a certain point within the arcuate region, the gravity center of the light rays is not registered with the center thereof, the result is like a case where the chief ray of the illumination light is projected while being deviated from a desired direction. This causes failure of correct exposure of the mask pattern.

Further, as shown in FIG. 19, on the mask 1007 surface, the EUV light is projected to the rectangular region 1015 which contains the arcuate region where the exposure is to be actually carried out. Thus, the EUV light which does not contribute to the exposure is waste and is blocked by the arcuate aperture 1012 before the wafer 1009. Namely, in conventional EUV reduction projection exposure apparatus, the loss of exposure light quantity is very large, which leads to prolongation of exposure time and to low throughput.

Further, in conventional EUV reduction projection exposure apparatuses such as shown at 1000, there is another problem that the optical axis of reflection light from the mask 1007 is not registered with the optical axis of the projection optical system 1008, such that the reflection light is eclipsed by the projection optical system 1008.

Moreover, in conventional EUV reduction projection exposure apparatuses such as shown at 1000, it is difficult to adjust, as desired, the illumination condition such as coherence factor a which corresponds to the ratio between the mask-side NA (numerical aperture) of the illumination optical system and the mask-side NA of the projection optical system) in accordance with a desired resolution linewidth or throughput, for example.

Additionally, in conventional EUV reduction projection exposure apparatuses such as shown at 1000, although the resolution is improved by use of short wavelength EUV light, there is still a requirement of further miniaturization of devices.

SUMMARY OF THE INVENTION

It is accordingly an object of the present invention to provide an illumination system and/or an exposure apparatus using the same, by which an illumination region can be illuminated with uniform illuminance and, as well, the light intensity gravity center of light rays impinging on the illumination region can be registered with the center of the light rays. It is another object of the present invention to provide a device manufacturing method which uses an exposure apparatus such as described above.

It is an object of the present invention to provide an illumination system, and exposure apparatus and/or a device manufacturing method using the same, by which the loss of light quantity can be reduced, the exposure time can be shortened, and the throughput can be enlarged.

It is a further object of the present invention to provide an illumination system, and exposure apparatus and/or a device manufacturing method using the same, by which the optical axis of reflection light from a mask can be registered with the optical axis of a projection optical system.

It is a yet further object of the present invention to provide an illumination system, and exposure apparatus and/or a device manufacturing method using the same, by which the illumination condition can be changed by use of light emitted from a light source of extreme ultraviolet region or X-ray region.

It is a still further object of the present invention to provide an illumination system, and exposure apparatus and/or a device manufacturing method using the same, by which a higher resolution, as compared with conventional resolutions, can be accomplished by use of light emitted from a light source of extreme ultraviolet region or X-ray region.

In accordance with an aspect of the present invention, there is provided * * * an illumination system for illuminating a surface to be illuminated, with light from a light source, characterized by: a first reflection type integrator; a first condensing mirror system for superposing light beams from said first reflection type integrator one upon another on the surface to be illuminated; a second reflection type integrator disposed between the light source and said first reflection type integrator; and a second condensing mirror system for superposing light beams from said second reflection type integrator one upon another on said first reflection type integrator.

In one preferred form, said first reflection type integrator has a reflection surface defined by segments, each being a portion of a cylindrical surface, which are disposed substantially in parallel to each other, such that an illumination region on the surface to be illuminated has an arcuate shape.

In one preferred form, said second reflection type integrator has a reflection surface defined by segments, each being a portion of a cylindrical surface, which are disposed substantially in parallel to each other, wherein generating lines of the cylindrical surfaces in said first and second reflection type integrators are substantially orthogonal to each other.

In one preferred form, said second reflection type integrator has a reflection surface defined by segments, each being a portion of a spherical surface, which are disposed two dimensionally.

In one preferred form, the cylindrical surface has one of a convex shape, a concave shape and a combination of convex and concave shapes.

In one preferred form, said illumination system is structured so that the surface to be illuminated is illuminated by critical illumination with respect to a meridional section, while it is illuminated by Koehler illumination with respect to a sagittal section.

In one preferred form, the illumination system further comprises (i) a stop disposed between said first condensing mirror system and the surface to be illuminated, and having an aperture for defining an illumination region on the surface to be illuminated, and (ii) a reflection optical system for imaging said aperture of said stop upon the surface to be illuminated, by use of light passed through said aperture.

In one preferred form, the illumination system further comprises an adjusting unit for eccentrically and/or rotationally moving at least one mirror of said reflection optical system, thereby to adjust an incidence angle of light impinging on the surface to be illuminated.

In one preferred form, the illumination system further comprises a stop having an aperture for defining an illumination region upon the surface to be illuminated.

In one preferred form, the illumination system further comprises an adjusting unit for eccentrically and/or rotationally moving at least one mirror of said first condensing mirror system, thereby to adjust an incidence angle of light impinging on the surface to be illuminated.

In accordance with another aspect of the present invention, there is provided an illumination system for illuminating a surface to be illuminated, characterized by a mirror system for directing light from a light source to the surface to be illuminated; and an adjusting unit for eccentrically and/or rotationally moving at least one mirror of said mirror system, thereby to adjust an incidence angle of light impinging on the surface to be illuminated.

In accordance with a further aspect of the present invention, there is provided an illumination system for illuminating a surface to be illuminated, with light from a light source, characterized by: a first reflection type integrator; a first optical system for projecting light from the light source onto said first reflection type integrator; and a second optical system for superposing light beams from said first reflection type integrator one upon another on the surface to be illuminated; wherein said first optical system includes a changing unit for changing a diameter and/or a shape of light impinging on said first reflection type integrator.

In one preferred form, said changing unit includes a plurality of stops having apertures being different from each other in respect to shape and/or size, and a driving system for selectively placing one of said stops at or adjacent a reflection surface of said first reflection type integrator.

In one preferred form, each aperture has a shape being elongated in a direction along a plane of incidence of the light being incident on said first reflection type integrator.

In one preferred form, said changing unit includes (i) a second reflection type integrator, a condensing mirror system for superposing light beams from said second reflection type integrator one upon another on said first reflection type integrator, and (ii) a stop having a variable aperture diameter and being disposed at or adjacent a reflection surface of said second reflection type integrator.

In one preferred form, said changing unit includes (i) a plurality of second reflection type integrators being different from each other in respect to emission angle of emitted light, (ii) a condensing mirror system for superposing light beams from said second reflection type integrators one upon another on said first reflection type integrator, and (iii) a driving system for selectively placing one of said second reflection type integrators at a path of light from the light source.

In one preferred form, the illumination system further comprises a stop having a variable aperture and being disposed at or adjacent a reflection surface of said second reflection type integrators.

In accordance with a still further aspect of the present invention, there is provided an illumination system for illuminating a surface to be illuminated, with light from a light source, characterized by: a first reflection type integrator having a reflection surface disposed at a pupil position; a first optical system for obliquely projecting light from the light source onto said first reflection type integrator; a second optical system for superposing light beams from said first reflection type integrator one upon another on the surface to be illuminated; and a stop disposed at or adjacent a reflection surface of said first reflection type integrator, said stop having an aperture of a shape being elongated in a direction along a plane of incidence of the light, being obliquely incident on said first reflection type integrator.

In one preferred form, the shape is effective to perform deformed illumination of an illumination region on the surface to be illuminated.

In one preferred form, the shape is a ring-like shape.

In one preferred form, the shape is a quadrupole shape.

In one preferred form, light from the light source has a wavelength not greater than 20 nm.

In accordance with a yet further aspect of the present invention, there is provided an exposure apparatus for illuminating a pattern formed on a reticle or a mask by use of an illumination system as recited above, and for projecting the pattern onto a workpiece by use of a projection optical system.

In accordance with a yet further aspect of the present invention, there is provided a device manufacturing method comprising a step for exposing a workpiece with a device pattern by use of an exposure apparatus as recited above, and a step for performing a predetermined process to the exposed workpiece.

The device manufacturing method when set forth in the claims has a protection coverage which extends to a device as an intermediate product or a final product. The device may be, for example, a semiconductor chip (such as LSI or VLSI), CCD, LCD, a magnetic sensor, or a thin film magnetic head.

These and other objects, features and advantages of the present invention will become more apparent upon a consideration of the following description of the preferred embodiments of the present invention taken in conjunction with the accompanying drawings.

BREIF DESCRIPTION OF THE DRAWINGS

DESCRIPTION OF THE PREFERRED EMBODIMENTS

Figure 1:
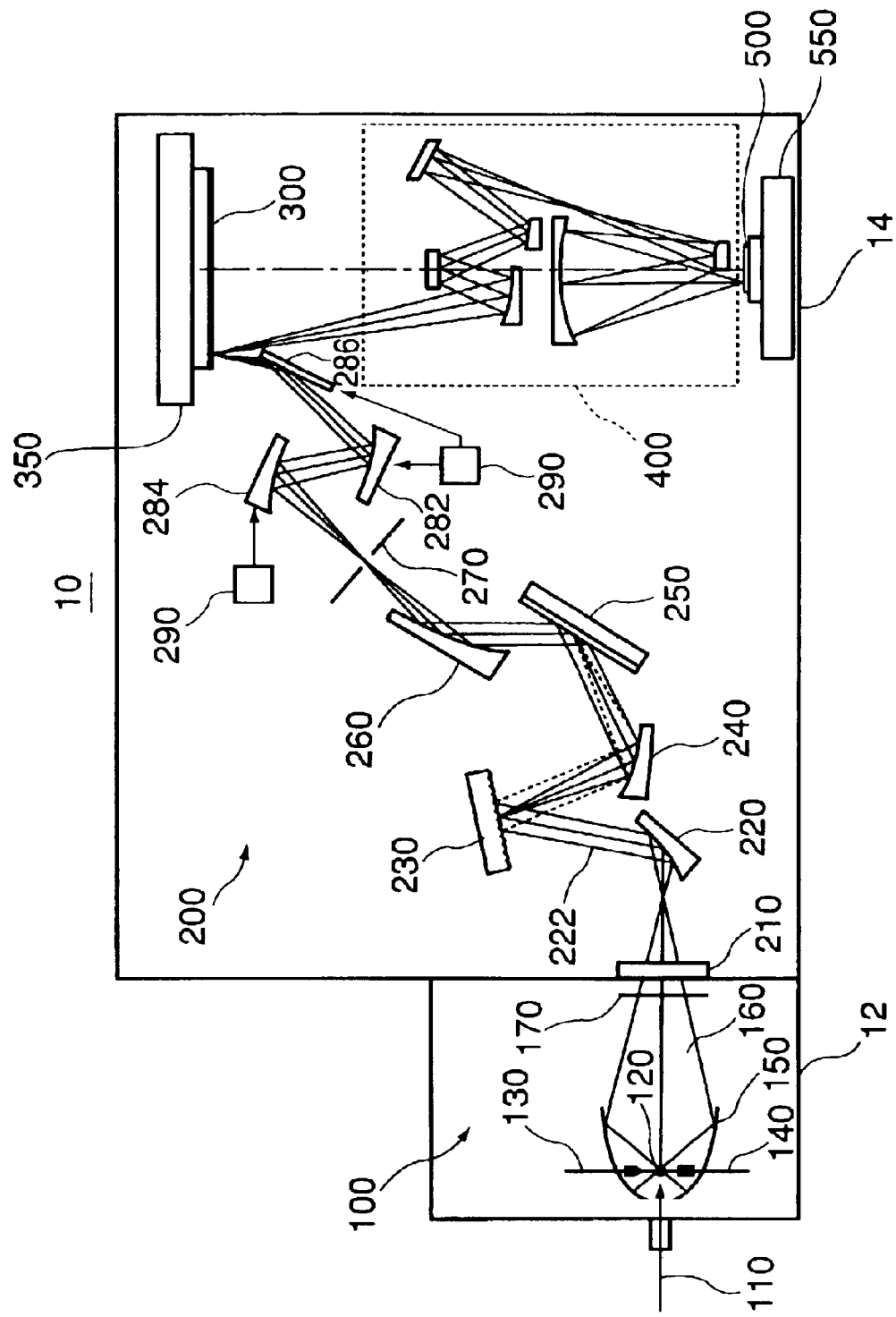
FIG. 1 is a schematic view of an exposure apparatus according to a first embodiment of the present invention.

Preferred embodiments of the present invention will now be described with reference to the attached drawings.

Referring to the drawings, an exposure apparatus 10 according to a first embodiment of the present invention will be explained in detail.

The exposure apparatus 10 of this embodiment is a projection exposure apparatus of step-and-scan exposure type which uses EUV light (wavelength=13.4 nm, for example) as illumination light for the exposure. As shown in FIG. 1, the exposure apparatus 10 comprises a light source unit 100, an illumination optical system 200, a mask 300, a projection optical system 400 and a workpiece 500 to be exposed. Further, the exposure apparatus 10 includes a mask stage 350 for carrying a mask 300 thereon, and a wafer stage 500 for carrying a workpiece 500 thereon. The mask state 350 and the wafer stage 550 are connected to a control unit (not shown), by which they are drive-controlled. The light source unit 100 and the illumination optical system 200 cooperate to constitute an illumination system. Here, FIG. 1 is a schematic view of the exposure apparatus.

The transmissivity of EUV light to atmosphere is low. In consideration of it, in the exposure apparatus 10, the light source unit 100 is accommodated in a vacuum container 12, and the remaining components 200–550 are accommodated in another vacuum container 14. It should be noted here that the present invention covers a case where at least the light path for EUV light is kept in a vacuum ambience.

In the light source unit 100, EUV light is produced from a plasma light emission point 120. The light source unit 100 includes a nozzle 130 for discharging liquid drops which provide a target for the plasma production, liquid-drop collecting means 140 for correcting liquid drops not having been irradiated with excited laser light, for reuse thereof, a rotational elliptical mirror 150, and a filter 170.

A high-power excited pulse laser light 110 is emitted from an excitation laser unit (not shown) which includes an excitation laser light source and a condensing optical system. This pulse laser light is arranged to be collected at the position of light emission point 120. The liquid drops (e.g. Xe) as a target of laser plasma light source are discharged from the nozzle 130, successively at constant time intervals, and they pass through the light collection point 120. As the thus discharged liquid drops just come to the position at 120, the excited laser pulse light irradiates the liquid drops, by which a high-temperature plasma light emission point 120 is generated. With the heat radiation from the plasma, EUV light is emitted radially.

Although Xe liquid drops are used as a target in this embodiment, alternatively, Xe gas may be discharged as a target from a nozzle into a vacuum and a cluster produced by adiabatic expansion may be used. As a further alternative, Xe gas as cooled and solidified by a metal surface may be used, or a tape using metal such as Cu may be selected. Further, while this embodiment uses a laser plasma method to produce EUV light, an undulator may be used as a EUV light source. Further, as regards the EUV light producing method, a Z pinch method or a discharging method such as hollow cathode triggered Z-pinch, capillary discharge, plasma focus, etc. may be used.

The EUV light emitted from the plasma emission point 120 is collected by the rotational elliptical mirror 150, whereby EUV light beam 160 is produced. The rotational elliptical mirror 150 has a reflection multilayered film formed thereon, to assure reflection at a good efficiency. Since it absorbs a portion of radiation energy from the high-temperature plasma 120, the temperature thereof becomes high during an exposure process. For this reason, the material therefor should be one such as metal as having good heat conductivity. Additionally, suitable cooling means (not shown) may be used to cool the same continuously. The filter 170 serves to block scattered particles (debris) from the plasma or regions about it, and also the filter intercepts wavelengths unnecessary for the EUV exposure. The EUV light beam is introduced into the illumination optical system 200 inside the vacuum container 14, from a window 210 provided at the interface between the containers 12 and 14. The window 210 has a function for passing the EUV light 160 while keeping the vacuum.

The illumination optical system 200 functions to illuminate the mask 300 uniformly, with EUV light of arcuate shape corresponding to an arcuate view field of the reflection type reduction projection optical system 100. It comprises rotational parabolic mirrors 220 and 260, a parabolic mirror 240, reflection type integrators 230 and 250, a masking blade 270, relay optical systems 282–286 (being represented by 280, unless specified otherwise), and an adjusting unit 290.

The rotational parabolic mirror 220 serves to reflect EUV light 160 introduced through the window 210, to produce a parallel light beam 222. The thus provided parallel EUV light 222 impinges on the reflection type convex-shaped cylindrical-surface integrator 230 having a plurality of convex-shaped cylindrical surfaces 232. Theses cylindrical surfaces 232 of the integrator 230 produce secondary light sources, and EUV light rays emitted from these secondary light sources are collected and superposed by the parabolic mirror 240 one upon another, such that the reflection type integrator 250 having a plurality of convex-shaped cylindrical surfaces 252 can be illuminated with a substantially uniform intensity distribution with respect to a direction along which the cylindrical surfaces of the integrator 250 is arrayed.

Figure 7:
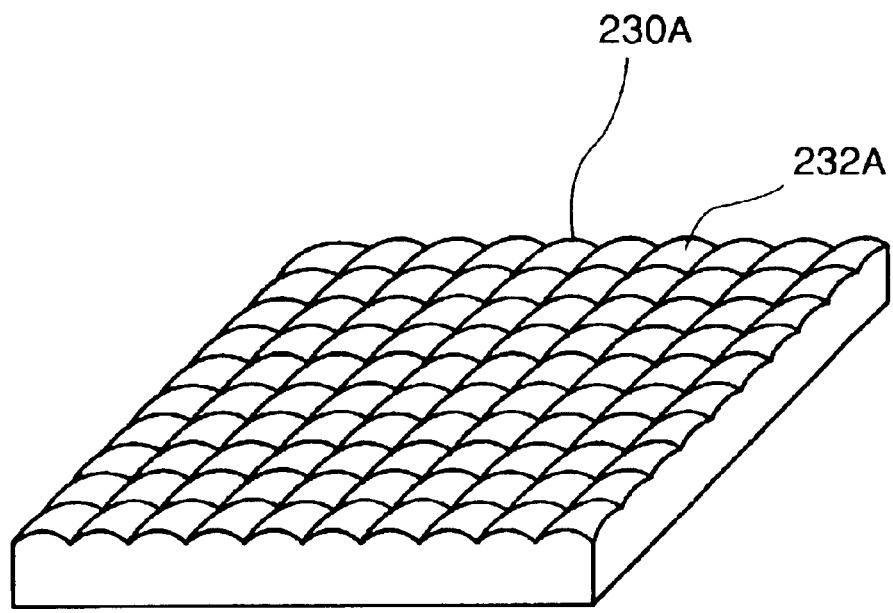
FIG. 7 is a schematic and perspective view of a modified example of a light source side reflection type integrator, shown in FIG. 1.

The reflection type integrator 230 has a plurality of cylindrical surfaces which serves, together with the rotational parabolic mirror 240, to illuminate the reflection type integrator 250 uniformly (i.e. substantially in Koehler illumination, to be described later). With this arrangement, the light intensity distribution inside an arcuate illumination region (to be described later), with respect to the radial direction, can be made substantially uniform. Simultaneously, the effective light source distribution to be provided by the reflection type integrator can be made uniform. The reflection type integrators 230 and 250 may be replaced by a fly's eye mirror 230A having a repetition period such as shown in FIG. 7, in which a large number of small convex or concave spherical surfaces are arrayed two-dimensionally.

Figure 2A:
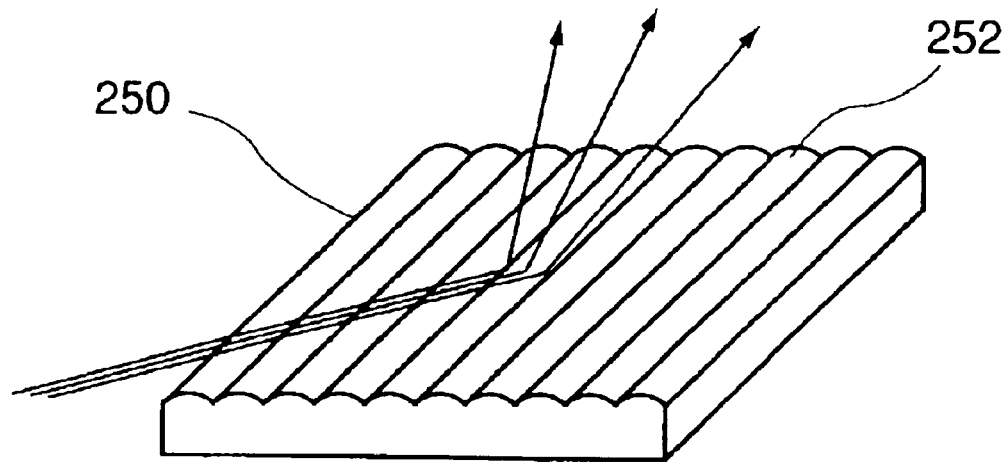
FIG. 2A is a schematic and perspective view of a convex type integrator which is applicable to a reflection type integrator of the exposure apparatus shown in FIG. 1.
Figure 2B:
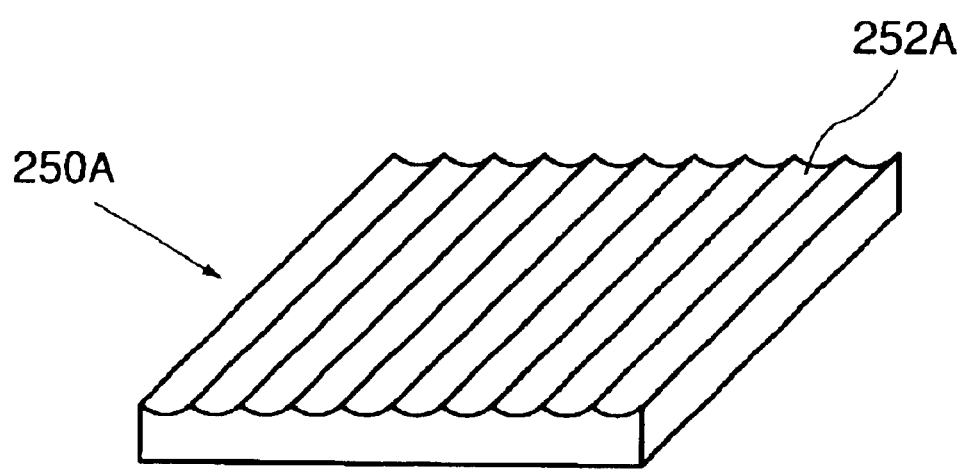
FIG. 2B is a schematic and perspective view of a concave type integrator which is applicable to a reflection type integrator of the exposure apparatus shown in FIG. 1.

The reflection type integrator 250 has a plurality of cylindrical surfaces, and it functions to illuminate the mask surface uniformly. Here, referring to FIGS. 2A–4B, the principle of uniform illumination of an arcuate region by the integrator 250 will be explained in detail. FIG. 2A is a schematic and perspective view for explaining a case where parallel light is incident on the integrator 250 having a plurality of reflection type convex-shaped cylindrical surfaces 252. The direction of incidence of light depicts the case of integrator 250. FIG. 2B is a schematic and perspective view of an integrator 250A having a plurality of reflection type concave-shaped cylindrical surfaces 252A, providing a similar effect as of that of FIG. 2A. Also, the integrator 230 has a similar structure as of the integrator 250 having reflection type convex-shaped cylindrical surfaces 252. Both of the integrators 230 and 250 may be replaced by integrators 250A having reflection type concave-shaped cylindrical surfaces 252A shown in FIG. 2B. Alternatively, they may be provided by a combination of convex-shaped and concave-shaped cylindrical surfaces.

As shown in FIG. 2A, when approximately parallel EUV light is incident on the reflection type integrator 250 having a plurality of cylindrical surfaces 252, the integrator 250 produces secondary light sources. In addition to it, the angular distribution of the EUV light emitted from these secondary light sources has a conical shape. Then, by reflecting the EUV light by use of a reflection mirror having a focal point placed at the secondary light source position, and subsequently by illuminating the mask 300 or a plane conjugate with the mask 300 with the reflected EUV light, illumination in arcuate shape is accomplished.

Figure 3:
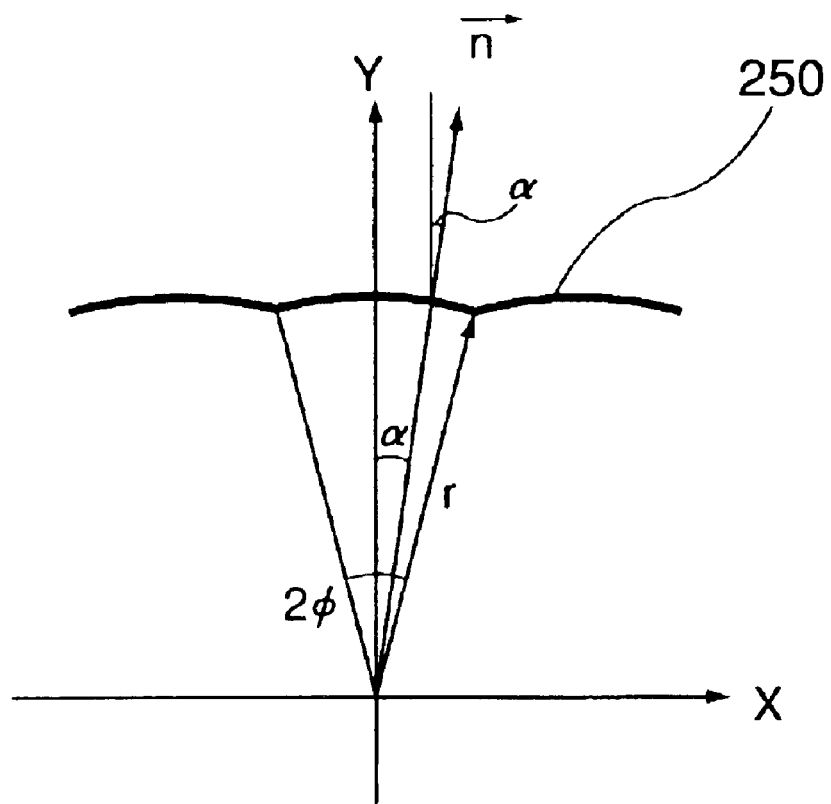
FIG. 3 is a schematic view for explaining the operation of a reflection type integrator having a convex cylindrical surface as shown in FIGS. 2A and 2B.
Figure 4A:
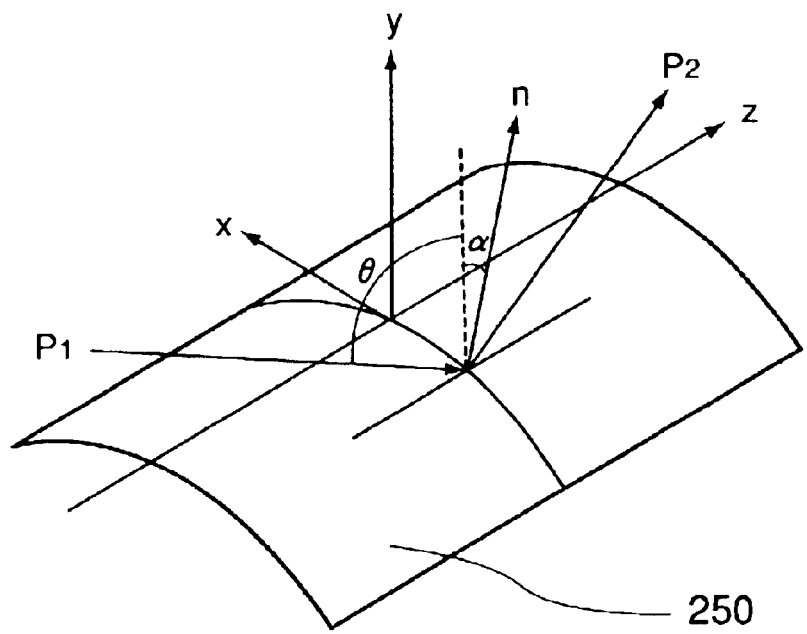
FIG. 4A is a perspective view for explaining reflection of light at a cylindrical surface of a reflection type integrator such as shown in FIG. 3.
Figure 4B:
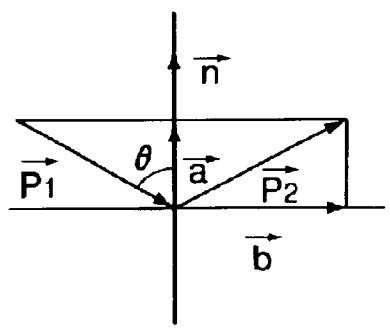
FIG. 4B is a vector diagram for explaining reflection of light at a cylindrical surface of a reflection type integrator such as shown in FIG. 3.
Figure 5:
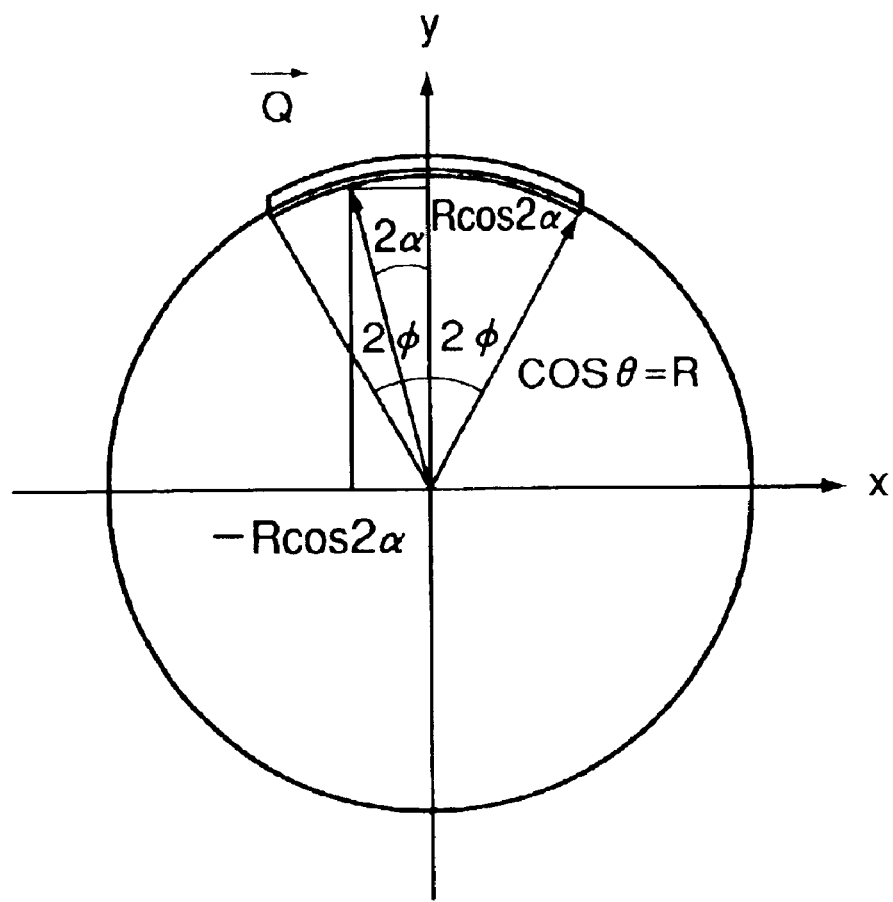
FIG. 5 is a schematic view for explaining angular distribution of light as reflected by the cylindrical surface of FIG. 4A.

FIG. 3 is a fragmentary enlarged view of the integrator 250 having reflection type convex-shaped cylindrical surfaces 252. FIGS. 4A and 4B are a perspective view and a vector diagram, respectively, for explaining reflection of EUV light at a cylindrical surface 252 of the integrator 250, having reflection type convex-shaped cylindrical surfaces 252. FIG. 5 is a schematic view for explaining angular distribution of EUV light reflected by a cylindrical surface 252 of the integrator 250, having reflection type convex-shaped cylindrical surfaces 252.

For explanation of the operation of the reflection type integrator 250 having plural cylindrical surfaces 252, the action of reflected light to be caused when parallel light is incident on a single cylindrical reflection mirror will be described first by reference to FIGS. 4A and 4B.

Now, as shown in FIG. 4A, a case where parallel light is incident on a single cylindrical surface at an angle θ with respect to a plane (x-y plane) perpendicular to the z axis (central axis of the cylindrical surface), is considered. Where the light-ray vector of the incident parallel light is P1 and a normal-line vector of the reflection surface of cylindrical shape is n, then P1 and n can be defined by the following vector equations. Here, for convenience, arrows to be attached to P1, n, and so on, representing the vectors, are omitted, except for those as actually attached below.

$$\vec{P1} = \begin{pmatrix} 0 \\ -\cos\theta \\ \sin\theta \end{pmatrix} \quad (3)$$

$$\vec{n} = \begin{pmatrix} -\sin\alpha \\ \cos\alpha \\ 0 \end{pmatrix} \quad (4)$$

Referring to FIG. 4B, if the orthogonal projection vector of n to −P1 is "a", then "a" can be expressed by the following equation:

$$\vec{a} = |\vec{P1}|\cos\omega \cdot \vec{n}$$

$$= |\vec{P1}| \cdot \{(-\vec{P1} \cdot \vec{n})/(|-\vec{P1}||\vec{n}|)\} \cdot \vec{n}$$

$$= -(\vec{P1} \cdot \vec{n})\vec{n} \quad (5)$$

Also, the light-ray vector of reflection light P2 is given by:

$$\vec{P2} = \vec{a} + \vec{b} = \vec{a} + (\vec{P1} + \vec{a}) = \vec{P1} + 2\vec{a} \quad (6)$$

From equations (3) and (4), P2 is given by:

$$\vec{P2} = \vec{P1} - 2(\vec{P1} \cdot \vec{n})\vec{n} \quad (7)$$

$$= \begin{pmatrix} 0 \\ -\cos\theta \\ \sin\theta \end{pmatrix} + 2\cos\theta\cos\alpha \begin{pmatrix} -\sin\alpha \\ \cos\alpha \\ 0 \end{pmatrix} = \begin{pmatrix} -\cos\theta\sin2\alpha \\ \cos\theta\cos2\alpha \\ \sin\theta \end{pmatrix}$$

If the light-ray vector of the reflection light P2 as projected upon the x-y plane is Q, it can be defined by the following equation:

$$\vec{Q} = \begin{pmatrix} -\cos\theta\sin2\alpha \\ \cos\theta\cos2\alpha \end{pmatrix} = \cos\theta \cdot \begin{pmatrix} -\sin2\alpha \\ \cos2\alpha \end{pmatrix} = R\begin{pmatrix} -\sin2\alpha \\ \cos2\alpha \end{pmatrix} \quad (8)$$

Thus, when plotted in a phase space shown in FIG. 5, Q is present on a periphery of a radius R=cos θ and in the range of −2φ≦2α≦2φ. Namely, the reflected light P2 is divergent light of conical shape, and the secondary light source is at the position of the peak (apex) of the cone. Where the cylindrical surface is concave, the secondary light source is present as a real image, outside the reflection surface. If it is convex, the secondary light source is present as a virtual image, inside the reflection surface.

Further, where the reflection surface is limitedly defined only by a portion of a cylindrical surface such as shown in FIG. 3 and the center angle thereof is 2φ, the light-ray vector of reflected light P2 is, as shown in FIG. 5, arcuate with a center angle 4φ upon the x-y plane.

Subsequently, a case where parallel light is incident on a reflection mirror which comprises a portion of a cylindrical mirror and where a rotational parabolic reflection mirror having its focal point disposed at the secondary light source position and also having a focal length f is provided and, on the other hand, the surface to be illuminated is placed at a position spaced by f from this rotational parabolic reflection mirror, is considered. The light emitted from the secondary light sources is divergent light of conical shape, and after being reflected by the reflection mirror having a focal length f, it is transformed into parallel light. The reflection light at this moment is a sheet-like beam having an arcuate cross-sectional shape with a radius f×cos θ and a center angle 4φ. Thus, only an arcuate region with a radius f×cos θ and a center angle 4φ can be illuminated.

While the foregoing description concerns a single cylindrical reflection surface, next, as shown in FIG. 2A1, a case where a wide-arc integrator 250 has a number of cylindrical surfaces 252 arrayed in parallel to each other and where parallel light of a thickness D is incident on it along a direction as illustrated, will be considered. If a rotational parabolic reflection mirror and a mask 300 are disposed as like the foregoing example, the angular distribution of light reflected by the reflection mirror having a number of cylindrical surfaces arrayed in parallel to each other is unchanged from the preceding example. Thus, upon the mask 300, an arcuate region with a radius f×cos θ and a center angle 4φ can be illuminated. Further, since the light rays impinging on a single point upon the mask 300 come from the whole irradiation region on the reflection mirror having a number of arrayed cylindrical surfaces, the angular extension of them is D/f. The numerical aperture NA is given by sin θ, and thus the numerical aperture of the illumination optical system 200 is D/(2f). If the numerical aperture of the projection optical system 400 at the mask 300 side is NAp1, the coherence factor σ is σ=D/(2fNAp1). Therefore, in accordance with the thickness of parallel light impinging on the integrator 250, an optimum coherence factor θ can be set.

On the basis of the principle of illuminating an arcuate region with use of an integrator 250 described above and additionally by using an integrator 230, the present embodiment assures more effective and uniform illumination of an arcuate region. Now, referring to FIG. 6 particularly showing integrators 230 and 250 of FIG. 1, the structure of this embodiment will be described in greater detail.

Figure 6:
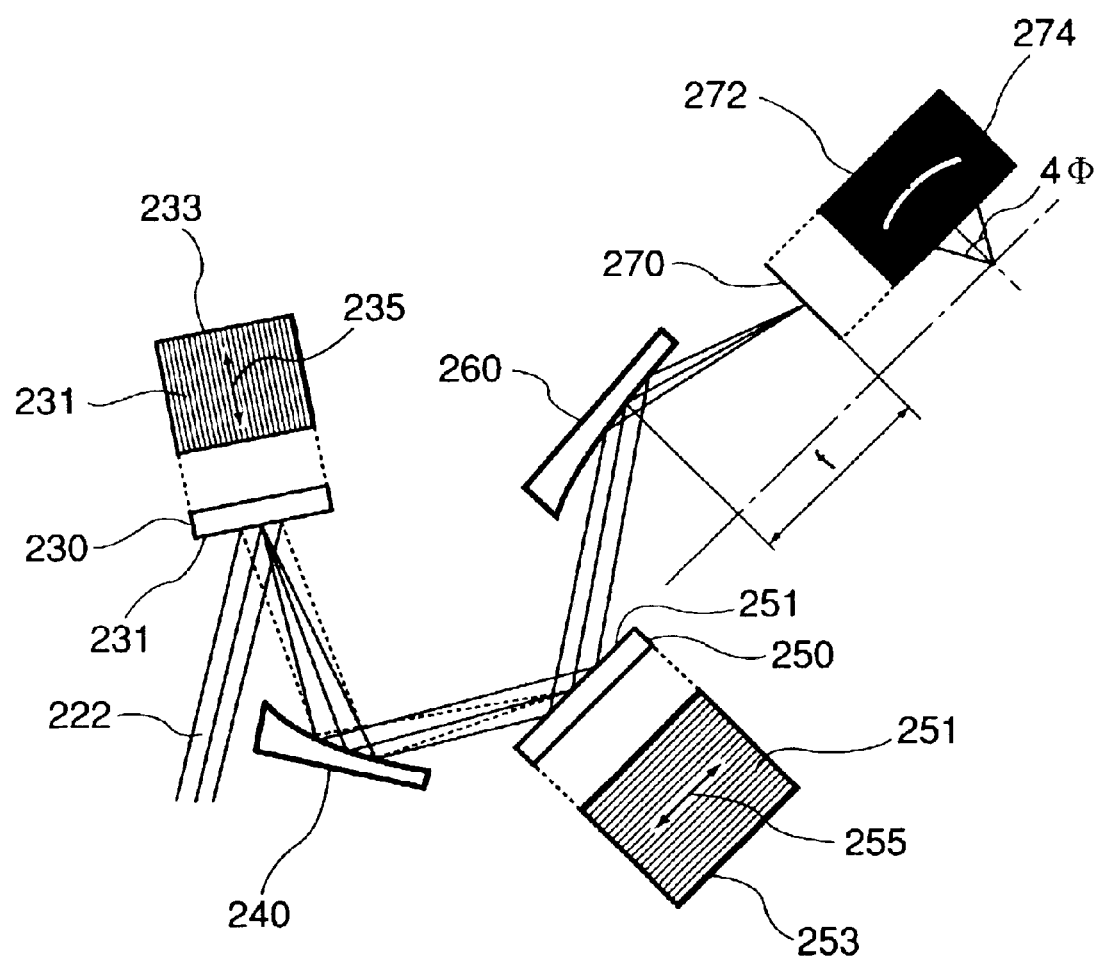
FIG. 6 is an enlarged view for explaining arcuate illumination defined by two integrators of the exposure apparatus shown in FIG. 1.

In FIG. 6, the straight line direction 235 (generating line direction) of plural convex-shaped cylindrical reflection surfaces 232 of the integrator 230 is perpendicular to the sheet of the drawing. Denoted in the drawing at 233 is the bottom face of the integrator 230. Also, the straight line direction 255 of the plural convex-shaped cylindrical reflection surfaces 252 of the integrator 250 is parallel to the sheet of the drawing. Denoted in the drawing at 253 is the top face of the integrator 250.

As described hereinbefore, it is an important feature of this embodiment that, as regards the spatial disposition of the two integrators 230 and 250, the array direction of the convex-shaped cylindrical reflection surfaces 232 and the array direction of the convex-shaped reflection surfaces 255 are disposed orthogonally to each other. This arrangement assures uniform arcuate illumination, to be described below.

When an approximately parallel EUV light beam 222 is incident on the reflection surface 231 of the integrator 230 such as shown in FIG. 6, that is, perpendicularly with respect to the direction 235, a virtual image of secondary light sources is produced inside the integrator 230, and EUV light rays are reflected from the respective secondary light sources at a relatively small predetermined divergence angle θ1. Such divergent EUV light is reflected by a parabolic mirror 240, whereby it is incident on the reflection surface 251 of the integrator 250 as parallel light.

The parabolic mirror 240 is disposed so that its focal point position is substantially registered with the reflection surface 231 of the integrator 230, and reflection light rays from the respective cylindrical surfaces 232 on the reflection surface 231 are superposed one upon another on the reflection surface 251 of the integrator 250. Since it is sufficient for the parabolic mirror 240 to make uniform the light intensity distribution on the cylindrical reflection surface 251 of the integrator 250 with respect to the lengthwise direction (generating line direction), while the mirror should have a parabolic section, it is not always necessary to use a rotational parabolic mirror therefor. The parabolic mirror 240 is thus disposed in relation to the reflection surface 251 of the integrator 250 to approximately satisfy Koehler illumination. With this arrangement, upon the reflection surface 251 of the integrator 250, particularly, with regard to the direction of 255, more uniform intensity distribution is accomplished.

The EUV light beams reflected by the integrator 250 having plural convex-shaped cylindrical reflection surfaces are collected by the rotational parabolic mirror 260 as has been described with reference to FIGS. 2A–5, and a uniform arcuate illumination region is defined on the masking blade 270 which is disposed at the position of the focal distance f thereof.

The masking blade 270 has a light blocking portion 272 made of a material which absorbs EUV light, as well as an aperture 274 of arcuate shape, best suited for the exposure, as depicted in a front view illustrated in a portion of FIG. 6. The masking blade 270 serves to block unwanted stray light not contributable to the arcuate illumination, and also it has a function to set a desired slit width in cooperation with a slit width changing mechanism (not shown), and also to correct illuminance non-uniformness by changing the slit width locally.

With the structure described above, in the arcuate illumination region, as regards the angular direction along the arch (i.e. θ direction), plural light beams from plural cylindrical surfaces 252 of the integrator 250 are superposed one upon another, by which the uniformity is assured. As regards the radiation direction (i.e. r direction) perpendicular to the arch, the light beams from the integrator 230 are superposed one upon another, by which the uniformness is assured. As a result, the efficiency becomes much higher than conventional structures, and very uniform arcuate illumination is accomplished.

The EUV light passing through the arcuate opening of the masking blade 270 is converted by a relay optical system 280 into a desired magnification and, after that, it defines an arcuate illumination region on the reflection type mask 300 held on the mask stage 350, whereby arcuate illumination is carried out. The relay optical system 280 comprises plural mirror surfaces, and it has a function for enlarging or reducing the arcuate shape at a predetermined magnification.

The adjusting unit 290 is a chief-ray (optical axis) adjusting mechanism. It has a function for adjusting the reflection light from the reflection type mask 300 to be satisfactorily registered with the light entrance side optical axis of the projection optical system 400, by producing minute eccentric movement and rotational movement of the mirror position of the relay optical system 280.

Figure 8:
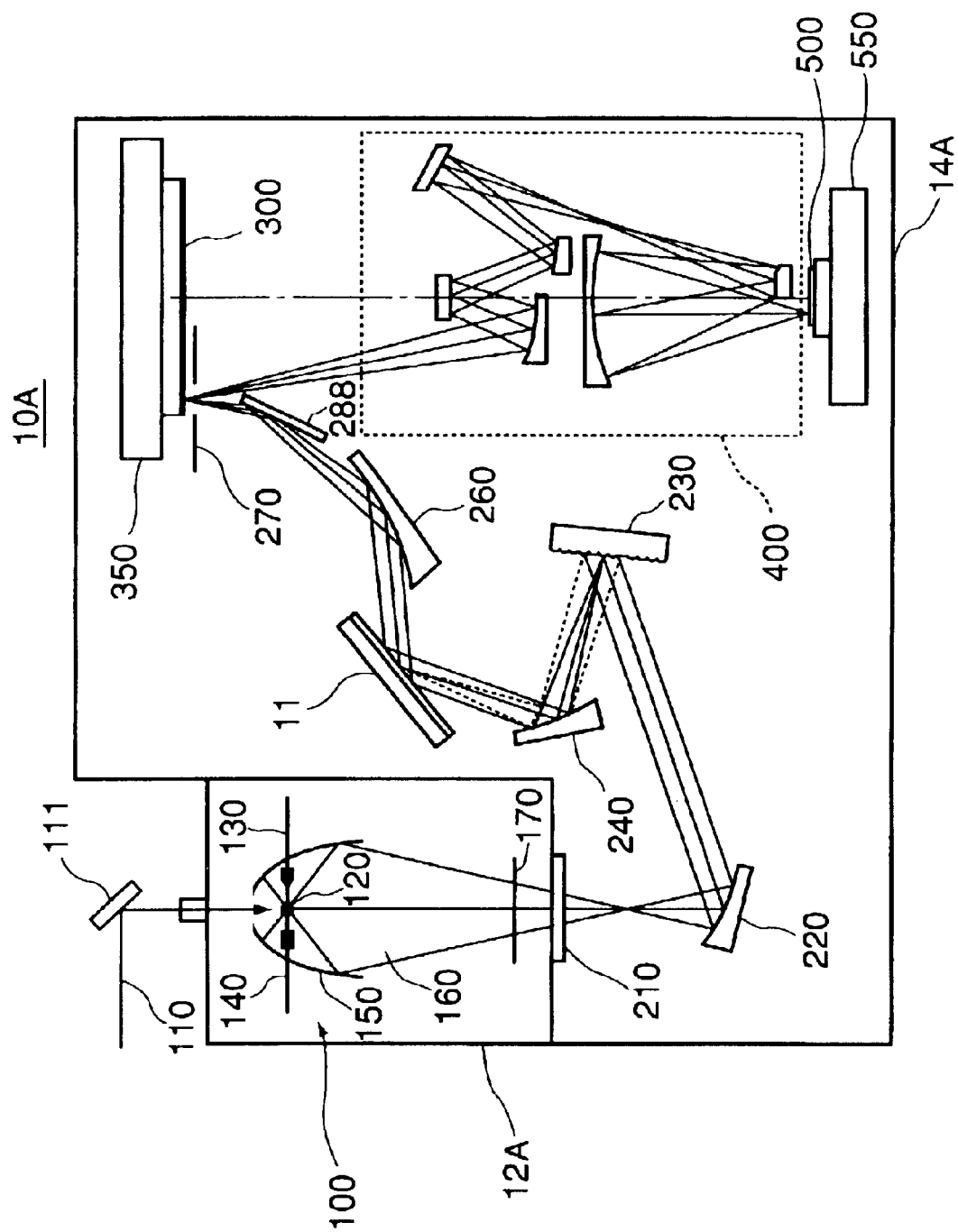
FIG. 8 is a schematic view of an exposure apparatus according to a second embodiment of the present invention.

Also, as shown in FIG. 8, the masking blade 270 may be disposed adjacent the mask 300, and the relay optical system 280 may be reduced. FIG. 8 is a schematic view of a main portion of a modified example of the exposure apparatus 10 of FIG. 1, and similar numerals are assigned to corresponding elements. Duplicate explanation will be omitted.

The surface of each mirror, including the mask 300, has formed thereon a multilayered film in which two types of materials having a large refractive index difference and a small absorptivity are alternately and repeatedly layered at a period corresponding to a half of the exposure wavelength. This is to assure a high reflectivity with respect to EUV light to be projected thereon approximately at normal incidence. For a higher reflectivity, usually, Mo or Si is used as the material. However, even in that case, the obtainable reflectivity is about 60 to 70% at the best.

For this reason, in the illumination optical system 200, in order to suppress the loss of reflection light intensity, the number of mirrors to be used must be made minimum. In accordance with this embodiment of the present invention, the masking blade having an arcuate-shape opening is disposed adjacent the reflection surface of the reflection type mask 300. This enables omission of the relay optical systems 282 and 284 in FIG. 1, and therefore the efficiency of the illumination optical system 200 is improved. It should be noted that, also in the case of FIG. 8, a chief ray (optical axis) adjusting unit, not shown, may be used to produce minute eccentric movement and rotational movement of the mirror 288, thereby to adjust the reflection light from the reflection type mask to be well registered with the light entrance side optical axis of the projection optical system 400.

Figure 9:
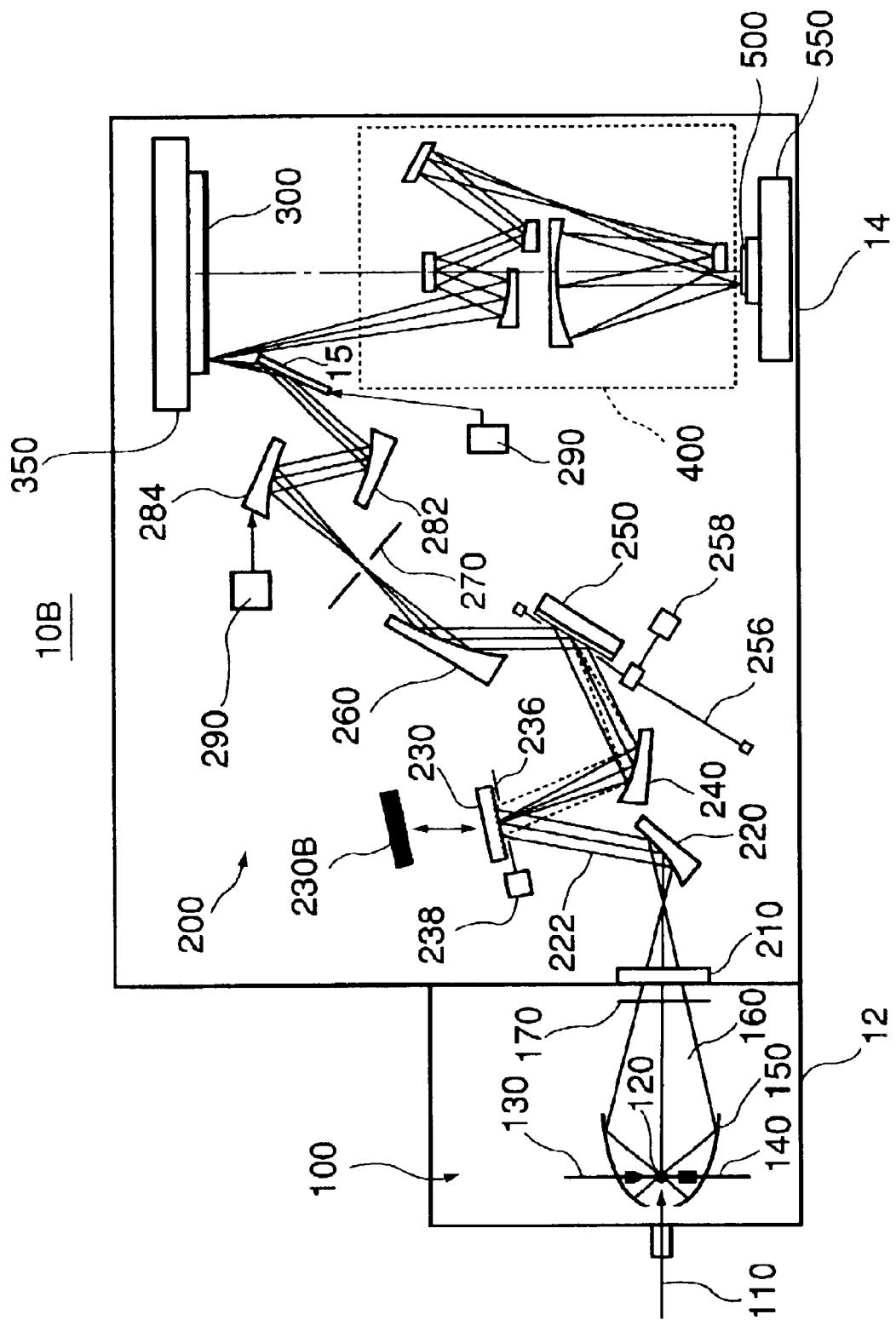
FIG. 9 is a schematic view of an exposure apparatus according to a third embodiment of the present invention.

Next, referring to FIG. 9, another embodiment of the present invention which enables setting a desired illumination condition, will be described. FIG. 9 is a schematic view of an exposure apparatus 10B, according to a third embodiment of the present invention.

As compared with the exposure apparatus 10 shown in FIG. 1, the exposure apparatus 10B includes two reflection-type integrators 230 and 230B which are interchangeably usable in accordance with a desired illumination condition, as well as stops 236 and 256, and stop driving systems 238 and 258, associated therewith.

The reflection type integrators 230 and 230B each is a reflection type integrator having a plurality of convex-shaped cylindrical surfaces, but they differ from each other in respect to the curvature radius (and thus the power) of the cylindrical surfaces. By interchanging the integrators 230 and 230B, the coherence factor σ, that is, the numerical aperture of the illumination system can be adjusted to a desired value. This will be described in detail, below.

Figure 10:
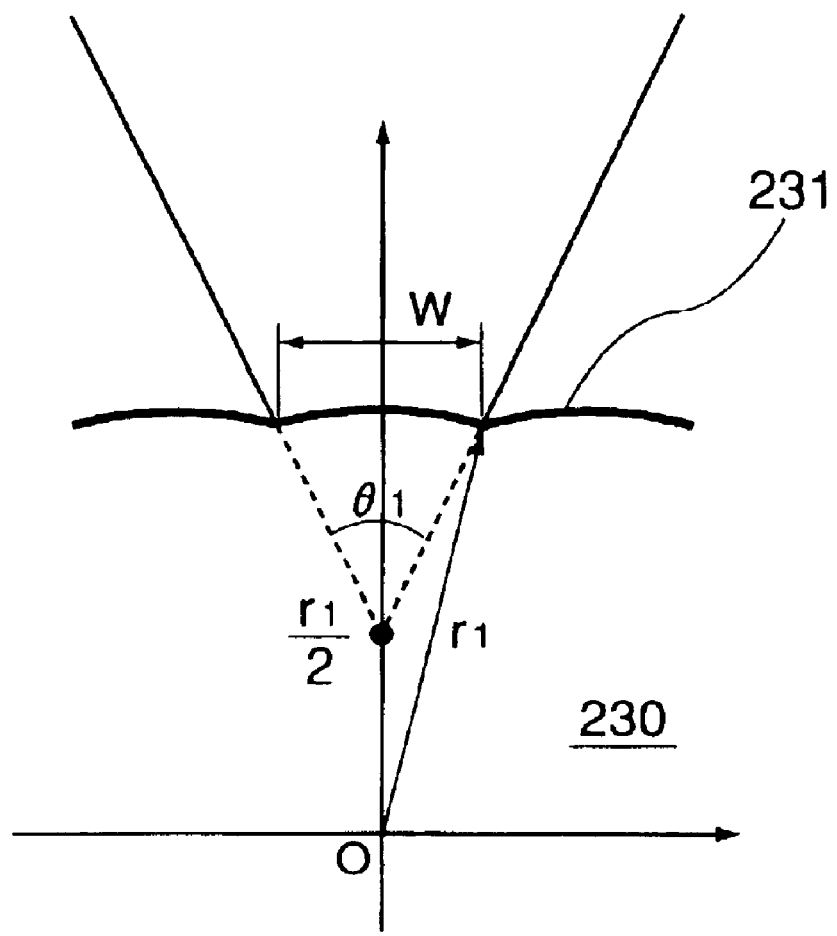
FIG. 10 is a schematic view for explaining one of light-source side integrators, provided in the exposure apparatus of FIG. 9.
Figure 11:
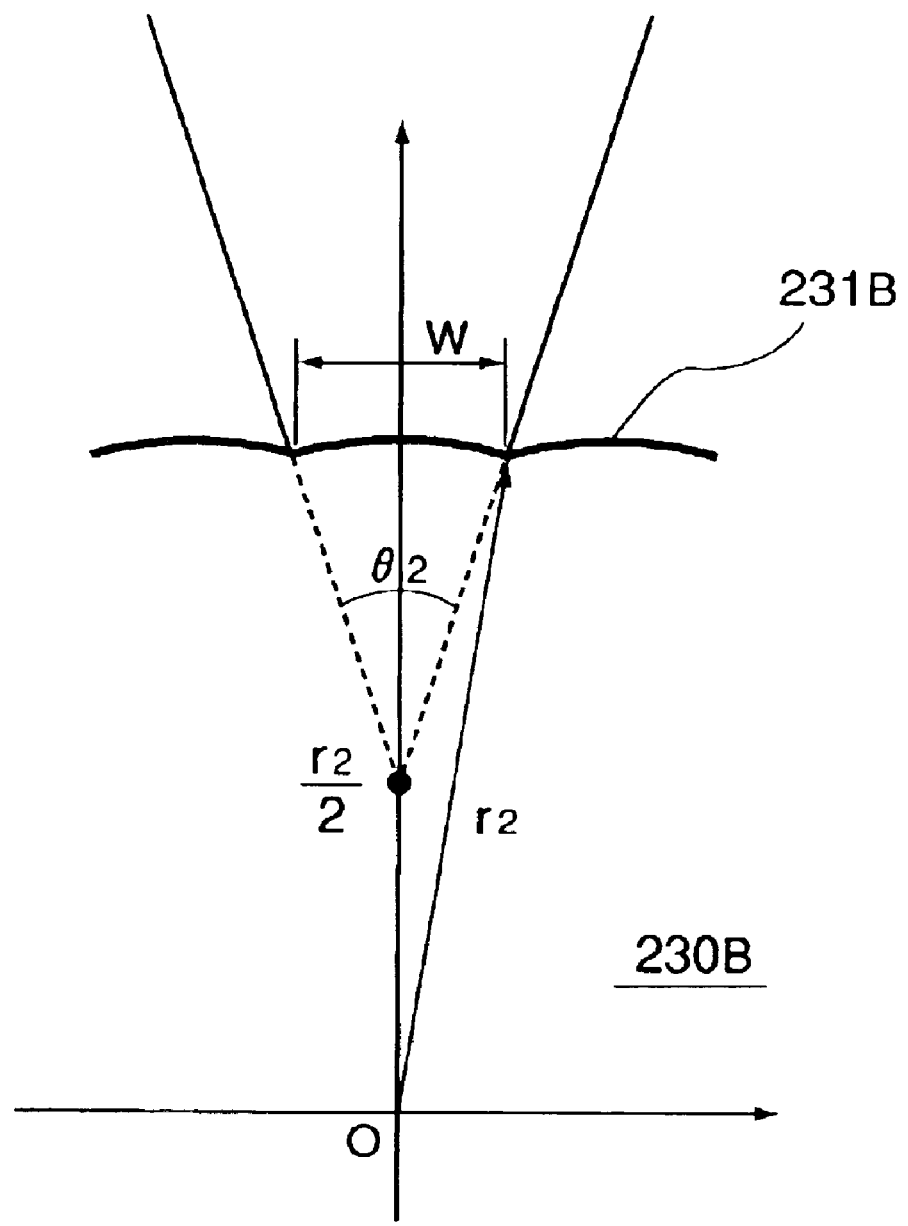
FIG. 11 is a schematic view for explaining the other light-source side integrator, provided in the exposure apparatus of FIG. 9.

FIG. 10 is a schematic view of the surface of an integrator 230 having a plurality of convex-shaped cylindrical surfaces 232, and FIG. 11 is a schematic view of the surface of an integrator 230B. In this example, the curvature radii r1 and r2 of the cylindrical surfaces 232 and 232B of the integrators 230 and 230B are set to satisfy a relation r1<r2.

Now, a case where a parallel light beam is projected and incident, from the above, upon the convex-shaped cylindrical reflection surface of the integrator 230, will be considered. In that case, although the light is diverged by the convex-shaped cylindrical reflection surface 231, there is a light convergence point being present as a virtual image, at the position of a distance r1/2 from the curvature center O, inside the convex surface. Thus, the reflection light is reflected as divergent light, at an emission angle θ1 given by the following equation:

$$\theta 1 \approx 2W/r1 \quad (9)$$

Similarly, in the integrator 230B, there is a light convergence point being present as a virtual image, at the position of a distance r1/2 from the curvature center O of the convex-shaped cylindrical surface 232B. Thus, the reflection light is diverged at a divergence angle θ2 given by the following equation:

$$\theta 2 \approx 2W/r2 \quad (10)$$

Here, from the relation r1<r2, there is a relation θ1>θ2 satisfied. Namely, the divergence angle θ1 of the light reflected by the integrator 230 is larger than the divergence angle θ2 of the light reflected by the integrator 230B.

Figure 12:
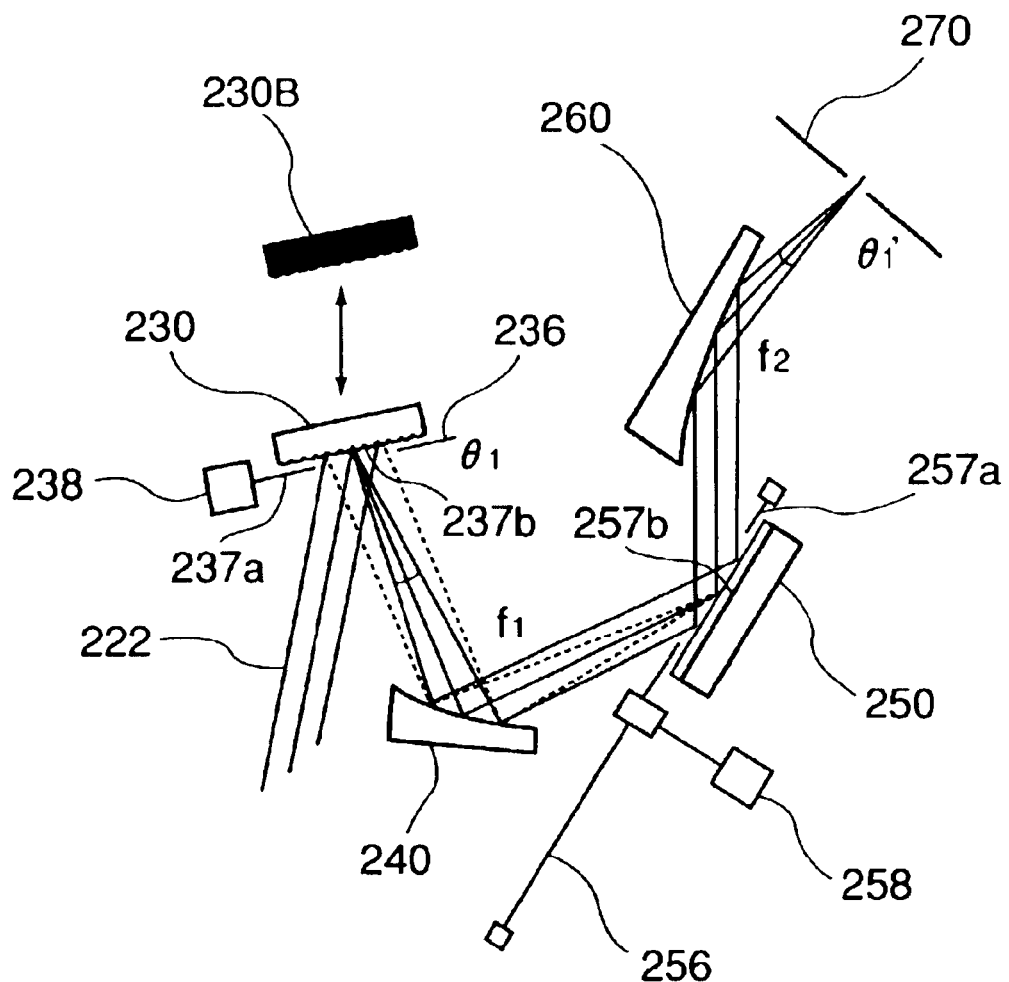
FIG. 12 is a schematic view for explaining the procedure for switching numerical apertures of an illumination optical system, by interchanging the light-source side integrators in the exposure apparatus of FIG. 9.
Figure 13:
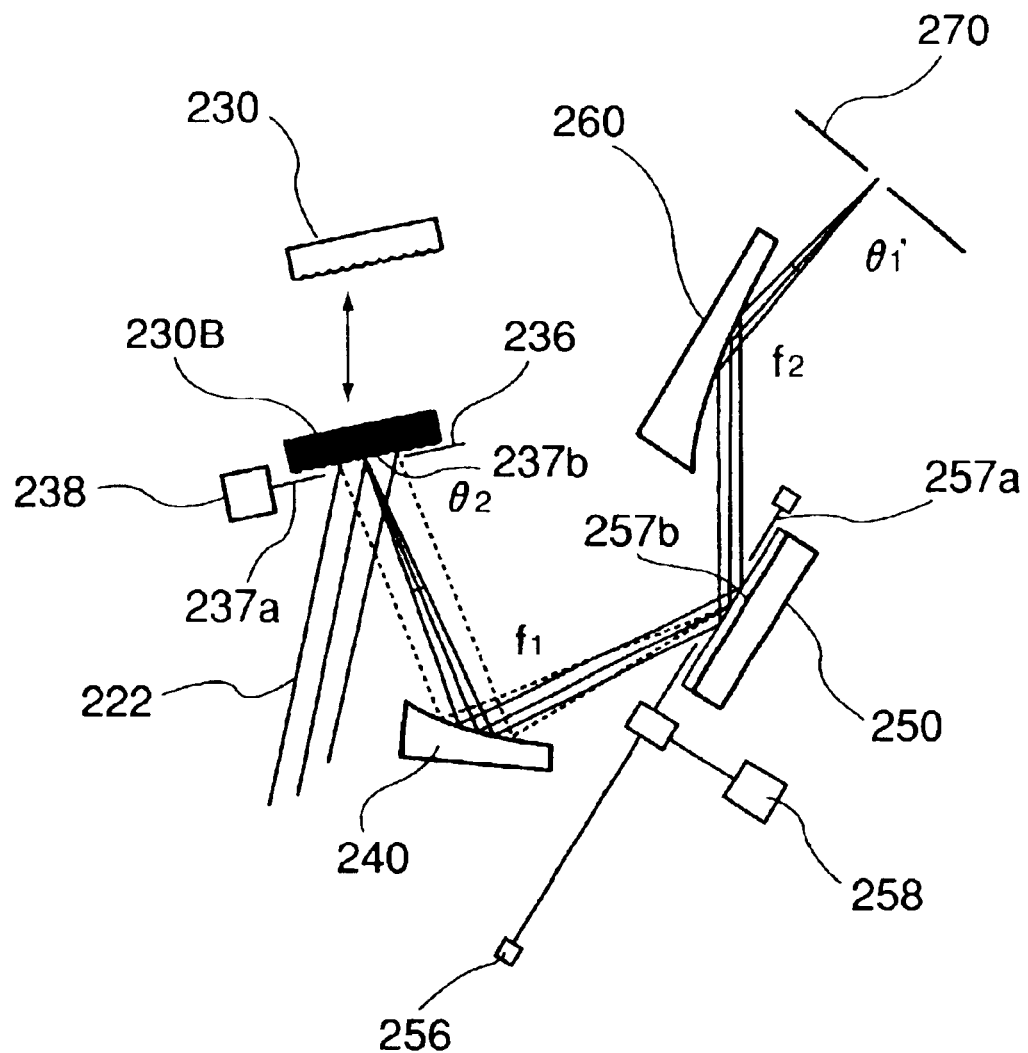
FIG. 13 is a schematic view similar to FIG. 12, for explaining the procedure for switching numerical apertures of an illumination optical system, by interchanging the light-source side integrators in the exposure apparatus of FIG. 9.

FIGS. 12 and 13 are schematic views for explaining the process of switching the numerical aperture of the illumination optical system 200, by interchanging the integrators 230 and 230B. In Figure 12, when an approximately parallel EUV light beam 222 passed through the stop 236 is incident on the reflection surface 231 of the integrator 230, as illustrated, a virtual image of the secondary light sources is produced inside the integrator 230, and EUV light is reflected from the respective secondary light sources at a predetermined divergence angle θ1. The thus divergent EUV light beams are collected by the parabolic mirror 240 having a focal length f1. Then, through a stop 256, the light is projected on the reflection surface 251 of the integrator 250 as approximately parallel light.

The EUV light beams reflected by the integrator 250, having a plurality of convex-shaped cylindrical reflection surfaces 251, are collected by a rotational parabolic mirror 260, such that a uniform arcuate illumination region is defined upon the masking blade 270, disposed at the position of the focal length f2 thereof. Here, the numerical aperture NA1 of the illumination optical system 200 at the masking blade 270 is given by the following equation:

$$NA1 = \theta1'/2 \approx (f1 \cdot \theta1)/2f2 \quad (11)$$

The numerical aperture NA1 corresponds to the quantity which is proportional to the numerical aperture of the illumination optical system 200 at the reflection type mask 300, and it is proportional to the divergence angle θ1.

As shown in FIG. 13, when the integrator 230 is changed by the integrator 230B by means of a switching mechanism (not shown), similarly, the numerical aperture NA3 of the illumination optical system 200 at the masking blade 270, is defined by the following equation:

$$NA2 = \theta2'/2 \approx (f1 \cdot \theta2)/2f2 \quad (12)$$

From the relation θ1>θ2, it is seen that, when the integrator 230 is used, a larger numerical aperture of the illumination optical system 200 is obtainable as compared with a case where the integrator 230B is used, and that the coherence factor σ is larger.

While an example of interchangeably using two integrators 230 and 230B has been described above, in order to change the coherence factor σ stepwise, more than two integrators having different divergence angles may be used interchangeably by use of a turret, for example. Alternatively, the incident light beam diameter may be controlled to a desired size by interchanging the stops 256 in response to the switching of the integrators 230. This assures much better precision for the a control.

The stop 236 is provided in front of the reflection type integrator 230 or 230B, and it has a light blocking portion 237a and an opening 237b. The stop 236 is driven by a stop driving system 238, by which the aperture diameter of the opening 237b can be changed successively. Further, the stop 236 may be disposed on or adjacent the surface of the integrator 230 or 230B. In that occasion, the light once passed through the stop 236 can be passed again through the stop 236 without being eclipsed. The aperture diameter of the opening 237b is adjusted in response to a signal applied to the stop driving system 238 from a control system (not shown). The stop driving system 238 may comprise any one of structures well known in the art, such as an iris stop mechanism for example.

Further, the integrator position may be so adjusted that the switching of the integrators does not cause a shift of the position of the plane in which the secondary light sources are defined. If there occurs illuminance non-uniformness on the surface being illuminated, due to the switching of the integrators, such illuminance non-uniformness may be corrected by adjusting the shape of the masking blade, for example.

By changing the aperture diameter of the stop 236, as depicted by broken lines in the drawing, the extension of the light beam incident on the integrator 250, along a direction parallel to the sheet of the drawing, can be adjusted. Namely, if in FIG. 9 the aperture diameter of the stop 236 becomes large, then, in FIG. 9, the width of the arcuate slit in the radial direction thereof, which slit defines an illumination region on the masking blade 270, can be adjusted. Further, not only the switching of the integrators 230 and 230B but also the thickness D of the light beam impinging on the integrator 250 may be adjusted through adjustment of the stop 256. With this procedure, the coherence factor a can be adjusted to a desired level, and also the illuminance non-uniformness can be corrected thereby.

The stop 256 is provided in front of the reflection type integrator 250. It is driven by the stop driving system 258 to change the aperture diameter thereof successively, by which a desired effective light source distribution can be defined. The stop 256 has a light blocking portion 257a and an opening 257b. The stop 256 may be disposed on or adjacent the surface of the integrator 250. In that occasion, the light once passed through the stop 256 can be passed again through the stop 256 without being eclipsed.

The EUV light beam passed through the stop 256 and reflected by the integrator 250 having a plurality of convex-shaped cylindrical reflection surfaces, is collected by a rotational parabolic mirror 260, whereby a uniform arcuate illuminance region is defined on the masking blade 270 which is disposed at the focal point position of the mirror.

Figure 14C:
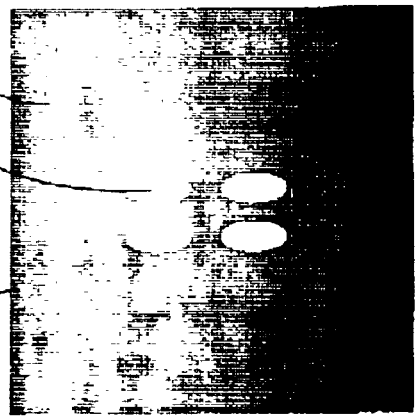
FIG. 14C is a plan view of a further example of a stop used with a mask-side integrator of the exposure apparatus shown in FIG. 9.
Figure 14B:
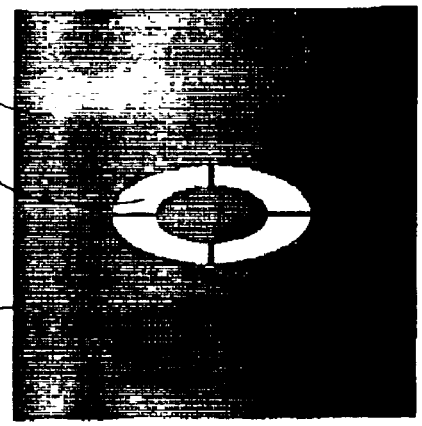
FIG. 14B is a plan view of another example of a stop used with a mask-side integrator of the exposure apparatus shown in FIG. 9.
Figure 14A:
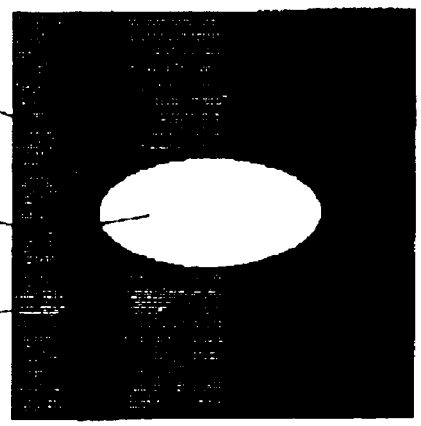
FIG. 14A is a plan view of an example of a stop used with a mask-side integrator of the exposure apparatus shown in FIG. 9.

Referring now to FIGS. 14A–14C and 15, the procedure for performing deformed illumination such as ring illumination, for example, by switching the stops 256, will be described. FIGS. 14A–14C are plan views of stops which can be applied to the stops 256. FIG. 14A shows a stop 256A for ordinary illumination. FIG. 14B shows a stop 256B for what is called ring illumination. FIG. 14C shows a stop 256C for what can be called quadrupole illumination. Several patterns such as illustrated may be prepared in the form of a turret, for example, as shown at the stop 256 in FIG. 9, and the turret may be rotated by the stop driving system 258 in response to a signal from a control system (not shown), to use a desired aperture shape selectively. Any other mechanical procedure may be used, without using a turret, such as interchanging plural stops sequentially, for example.

As shown in FIG. 9, the stop 256 is disposed adjacent the reflection surface 251 of the integrator 250. Thus, if the incidence angle of the light impinging on the integrator 250 is θ, at the reflection surface 251 of the integrator 250 the light beam diameter is extended in a direction (a direction parallel to the sheet of the drawing) along the plane of incidence of the light upon the integrator 250, and at a magnification 1/cos θ. In consideration of it, the shape of the aperture 257b of the stop 256 has to be extended in the same direction at a magnification of 1/cos θ. In FIG. 14A, while the stop 256A, for example, is used to restrict the incident light beam diameter into a circular shape, the aspect ratio of this ellipsoid is 1/cos θ. The same applies to the stops 256B of FIG. 14B and to the stop 256C of FIG. 14C.

Next, the principle of deformed illumination based on the stop 256 will be explained, while taking the stop 256B (for setting the ring illumination mode) as an example. The deformed illumination method is one of the procedures for ultra resolution technology, that is, RET (Resolution Enhanced Technology), which is based on reducing the value of the proportion constant k1 in equation (1).

Figure 15:
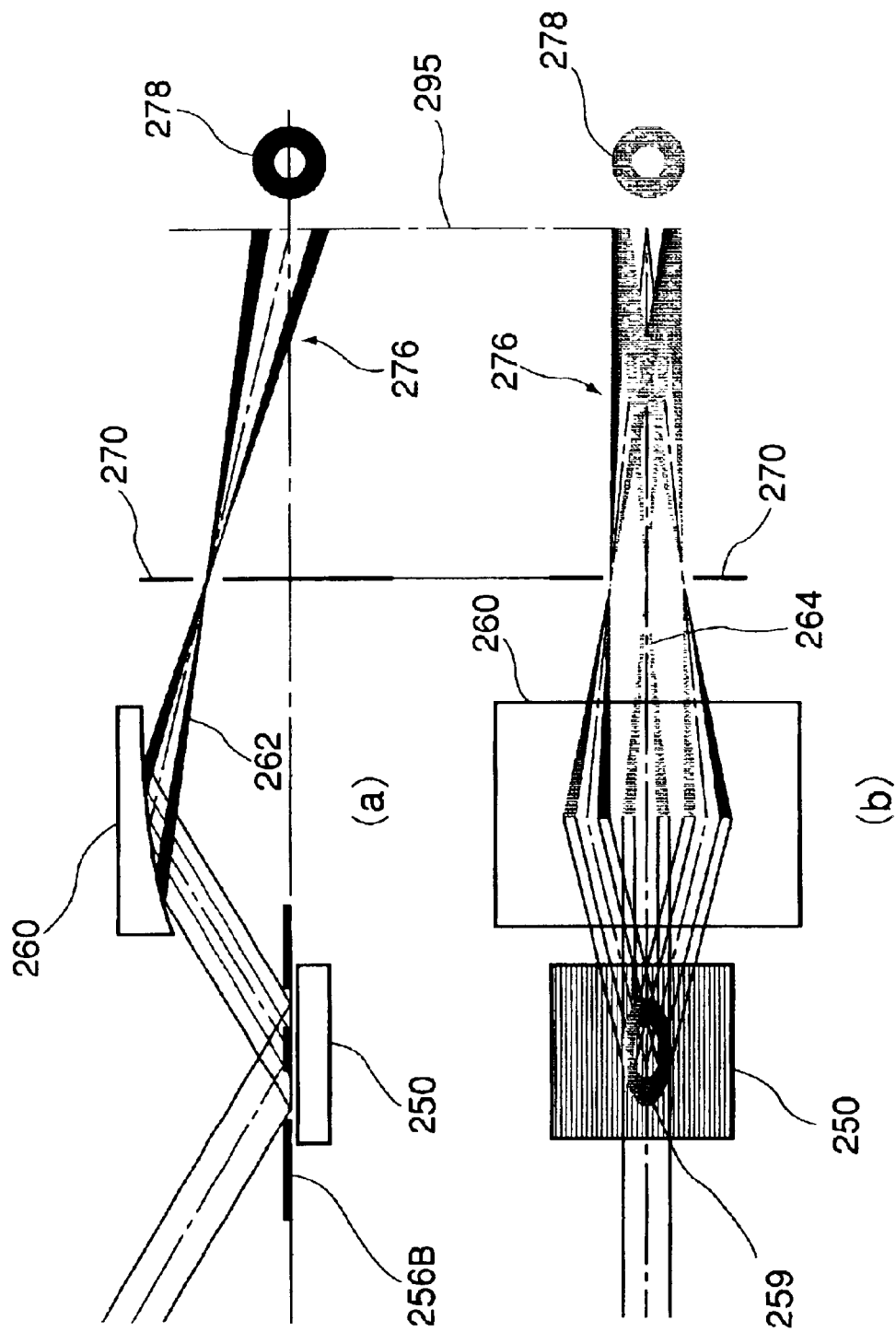
FIG. 15 is a schematic view for explaining a mask-side integrator, a rotational parabolic mirror and a masking blade, in the exposure apparatus of FIG. 9.

FIG. 15 shows integrator 250, rotational parabolic mirror 260 and masking blade 270 which are extracted from the structure shown in FIG. 9. FIG. 15(a) (upper half) is a side view, while FIG. 15(b) (lower half) is a top plan view as seen with the mirror 260 being transmitted. The stop 256B that defines the ring illumination mode is disposed as shown in FIG. 15A, but it is not illustrated in FIG. 15B for simplicity of the description.

As regards the light beam incident on the reflection type integrator 250, the optical axis central portion thereof and a portion at the outside diameter thereof are blocked by the stop 256, whereby the light is reflected in the form a ring-like distribution 259 having an elliptical shape. The shape of the distribution 259 corresponds to the shape of the aperture of the stop 256B. The thus produced light is collected by the rotational parabolic reflection mirror 260, whereby a uniform illumination region is defined at the position of the masking blade 270, which is placed at the position of the focal distance f2. Since the central portion of the light is blocked, the collected light is a light beam such as depicted by hatching 262 in FIG. 15. This is also the case with FIG. 15(b), and the light provided is a light beam depicted by hatching 264. In this manner, the reflection type integrator 250 functions to illuminate the mask 300 (through critical illumination) so that, with regard to the angular direction of the arcuate region, the secondary light sources are superposed one upon another, whereas as regards the radial direction of the arcuate region, all the light rays are collected at a single point. This means that, at the position of intersection between the chief ray and the optical axis, that is, at the pupil plane position 295, a distribution such as depicted by 278, namely, ring-like illumination is performed.

Referring back to FIG. 1, an exposure method according to this embodiment will be described. The structure following the mask 300 is the same, also in FIGS. 8 and 9.

The reflection type mask 300 comprises a multilayered film reflection mirror on which a non-reflective portion made of EUV absorptive material, for example, is formed to define a transfer pattern. The reflection type mask 300 is illuminated in an arcuate shape, and the EUV reflection light reflected from it bears information regarding the circuit pattern of the mask 300. The EUV light is then projected and imaged by a projection optical system 400, upon a workpiece 500 having a photosensitive material applied thereto, at an appropriate magnification suited for the exposure, whereby exposure of the circuit pattern is completed. The projection optical system 400 of this embodiment comprises a reflection type projection optical system having six mirrors, but the number of the mirror is not limited to six. A desired number such as 4, 5 or 8, for example, may be used.

A workpiece 500 is fixedly held by a wafer stage 550. It has a function for translation movement, in longitudinal and transverse directions along the sheet of the drawing. The movement thereof is controlled by use of a laser measuring device such as laser interferometer (not shown). If the magnification of the projection optical system 400 is M, the reflection type mask 300, for example, may be scanningly moved in a direction parallel to the sheet of the drawing, at a speed v and, simultaneously therewith, the workpiece 500 may be moved in a direction parallel to the sheet of the drawing, at a speed v/M. Through such synchronous scan, the whole surface exposure is carried out.

While this embodiment concerns wafer exposure, the workpiece 500 to be exposed is not limited to a wafer. It may be a liquid crystal substrate, for example, or any other member to be processed. The workpiece 500 is coated with a photoresist material. The photoresist coating process may include a pre-process, an adhesion enhancing agent applying process, a photoresist applying process, and a pre-baking process. The pre-process may include washing, drying and the like. The adhesion enhancing agent applying process is a process for improving the surface quality (hydrophobic treatment using an interfacial active agent), and an organic film such as HMDS (Hexamethyl-disilazane) may be coated or vapor deposited. The pre-baking is a baking step (sintering) to remove the solvent, but it is mild as compared with a similar step to be done after the developing process.

The wafer stage 550 supports the workpiece 500. As regards the wafer stage, any structure well known in the art can be applied to it. For example, a linear motor may be used to move the workpiece 500 in X, Y and Z directions. The mask 300 and the workpiece 500 are moved in synchronism with each other, by means of a control unit, not shown. Further, the positions of the mask stage 350 and the wafer stage 550 are monitored by means of a laser interferometer, for example, and these stages are moved at a constant speed ratio.

Next, referring to FIGS. 16 and 17, an embodiment of a device manufacturing method which uses an exposure apparatus described above, will be explained.

Figure 16:
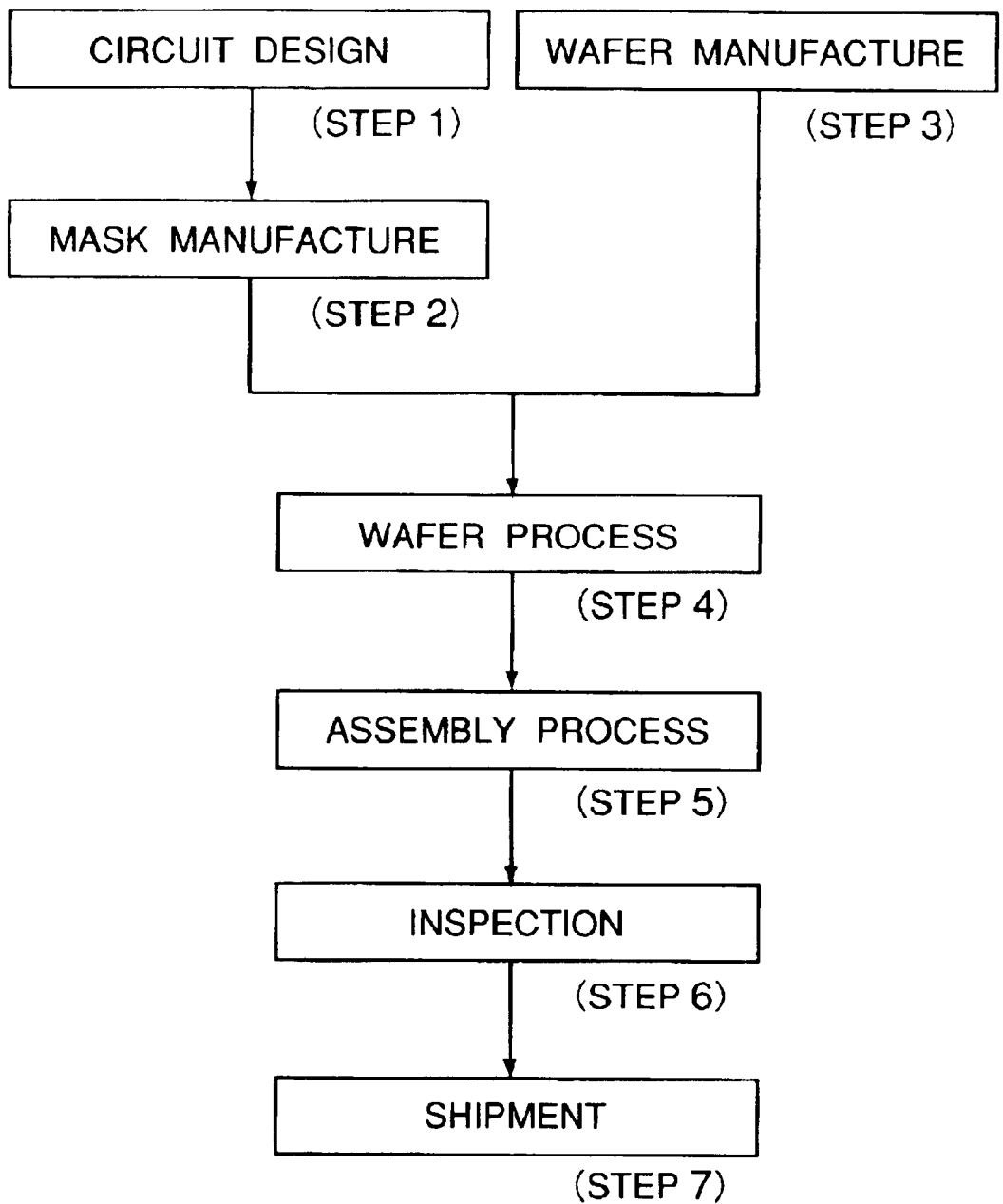
FIG. 16 is a flow chart for explaining processes for manufacturing a device such as semiconductor chip (IC or LSI), LCD, CCD, for example.

FIG. 16 is a flow chart for explaining the procedure of manufacturing various microdevices such as semiconductor chips (e.g., ICs or LSIs), liquid crystal panels, or CCDs, for example. The production of semiconductor chips will be explained here, as an example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 17:
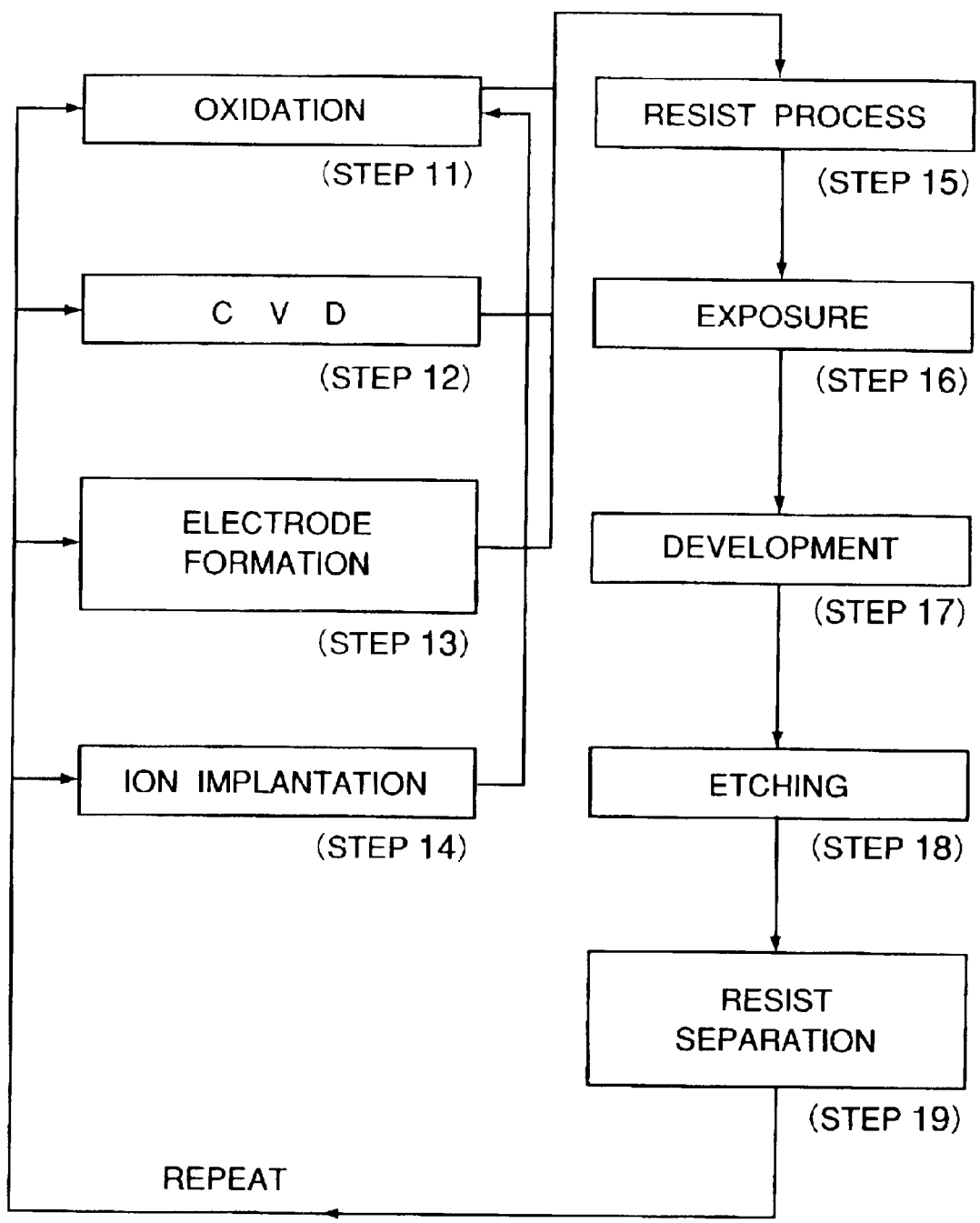
FIG. 17 is a flow chart for explaining details of a wafer process at step 4 in FIG. 16.
Figure 18:
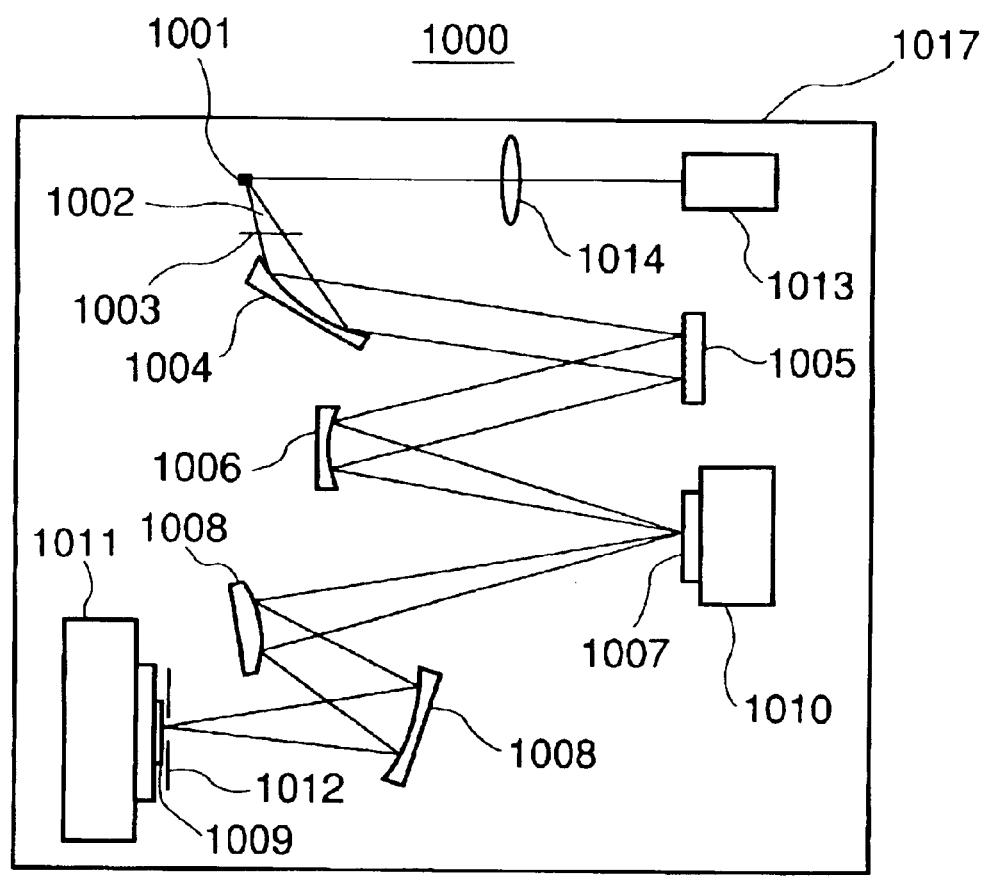
FIG. 18 is a schematic view of a conventional exposure apparatus.
Figure 19:
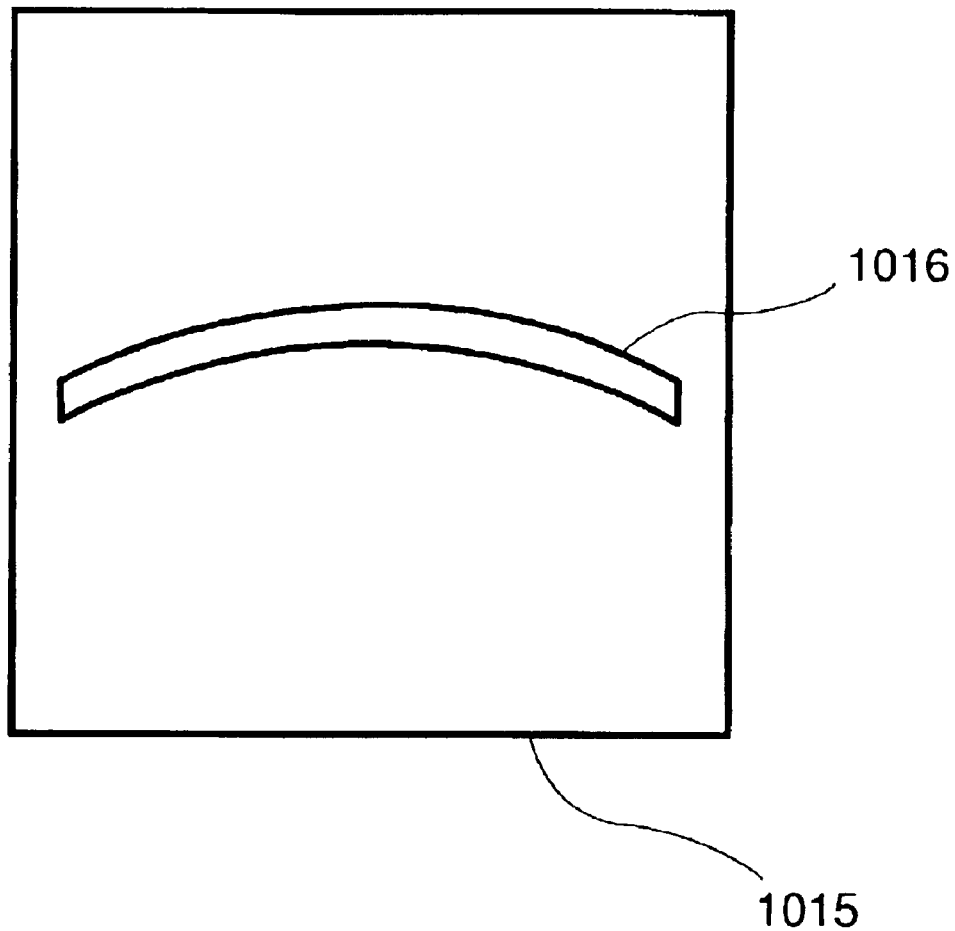
FIG. 19 is a plan view for explaining the relation between an illumination region on a mask and a region to be used for the exposure.

FIG. 17 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

The device manufacturing method of this embodiment assures production of higher quality devices. Thus, a device manufacturing method using the exposure apparatus 10 as described and a device itself produced as a resultant of the method, are included as phases of the present invention.

While the invention has been described with reference to the structures disclosed herein, it is not confined to the details set forth and this application is intended to cover such modifications or changes as may come within the purposes of the improvements or the scope of the following claims.

What is claimed is:

1. An illumination optical system for illuminating a surface to be illuminated, with light from a light source and having a wavelength not greater than 200 nm, said illumination optical system comprising:

a first reflection type integrator:

a first optical system for directing light from the light source onto said first reflection type integrator; and a second optical system for superposing a plurality of light beams from said first reflection type integrator, one upon another on the surface to be illuminated, wherein said first optical system includes a plurality of second reflection type integrators having different divergence angles of emitted light therefrom, and a collecting mirror for superposing a plurality of light beams from a second reflection type integrator one upon another on said first reflection type integrator, and wherein said second reflection type integrators can be selectively disposed on a light path for the light from the light source.

2. An illumination optical system according to claim 1, further comprising a stop having a variable aperture and being disposed upon or adjacent the reflection surface of said second reflection type integrator.

3. An exposure apparatus, comprising:

an illumination optical system for illuminating one of a reticle and a mask, with light from a light source and having a wavelength not greater than 200 nm; and a projection optical system for projecting a pattern of the reticle or the mask onto a workpiece, wherein said illumination optical system includes (i) a first reflection type integrator, (ii) a first optical system for directing light from the light source onto said first reflection type integrator, and (iii) a second optical system for superposing a plurality of light beams from said first reflection type integrator, one upon another on the surface to be illuminated, wherein said first optical system includes a plurality of second reflection type integrators having different divergence angles of emitted light therefrom, and a collecting mirror for superposing a plurality of light beams from a second reflection type integrator one upon another on said first reflection type integrator, and wherein said second reflection type integrators can be selectively disposed on a light path for the light from the light source.

4. A device manufacturing method, comprising the steps of:

exposing a substrate with a device pattern by use of an exposure apparatus as recited in claim 3, and performing a predetermined process to the exposed substrate.

* * * * *

UNITED STATES PATENT AND TRADEMARK OFFICE
CERTIFICATE OF CORRECTION

PATENT NO. : 6,919,951 B2
DATED : July 19, 2005
INVENTOR(S) : Toshihiko Tsuji

It is certified that error appears in the above-identified patent and that said Letters Patent is hereby corrected as shown below:

Column 4,
Line 13, after "provided" delete "* * *".

Column 8,
Line 39, after "metal" delete "as".

Column 10,
Line 25, change "cosω" to -- cosφ --.
Line 54, change "-2Φ≤2α≤2Φ" to -- -2φ≤2α≤2φ --.
Line 65, change "4Φ" to -- 4φ --.

Column 11,
Lines 11, 13 and 25, "4Φ" to -- 4φ --.

Signed and Sealed this

Thirteenth Day of December, 2005

JON W. DUDAS
*Director of the United States Patent and Trademark Office*